(12) United States Patent
Jeong et al.

(10) Patent No.: US 10,892,366 B2
(45) Date of Patent: Jan. 12, 2021

(54) THIN FILM TRANSISTOR AND VERTICAL NON-VOLATILE MEMORY DEVICE INCLUDING TRANSITION METAL-INDUCED POLYCRYSTALLINE METAL OXIDE CHANNEL LAYER

(71) Applicant: SAMSUNG ELECTRONICS CO., LTD., Suwon-si (KR)

(72) Inventors: Jae Kyeong Jeong, Seoul (KR); Yun Heub Song, Seoul (KR); Chang Hwan Choi, Seoul (KR); Hyeon Joo Seul, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 16/450,218

(22) Filed: Jun. 24, 2019

(65) Prior Publication Data
US 2019/0393353 A1  Dec. 26, 2019

(30) Foreign Application Priority Data

Jun. 25, 2018 (KR) .................. 10-2018-0072751

(51) Int. Cl.
*H01L 29/78* (2006.01)
*H01L 29/786* (2006.01)
(Continued)

(52) U.S. Cl.
CPC ...... *H01L 29/7869* (2013.01); *H01L 27/1156* (2013.01); *H01L 27/1158* (2013.01);
(Continued)

(58) Field of Classification Search
CPC ........... H01L 29/7869; H01L 27/11551; H01L 27/11553; H01L 27/11556;
(Continued)

(56) References Cited

U.S. PATENT DOCUMENTS 7,842,947 B2 * 11/2010 Nakatani ............. H01L 27/3246
257/40
9,455,324 B2 * 9/2016 Cao ..................... H01L 29/7869
(Continued)

FOREIGN PATENT DOCUMENTS

JP       2006-165528      6/2006
KR   10-2011-0135681 A   12/2011
(Continued)

OTHER PUBLICATIONS

Y. Shin, et al., "The Mobility Enhancement of Indium Gallium Zinc Oxide Transistors via Low-temperature Crystallization using a Tantalum Catalytic Layer", Scientific Reports, 2017, pp. 1-10.
(Continued)

*Primary Examiner* — Ida M Soward
(74) *Attorney, Agent, or Firm* — Lee IP Law, PC

(57) ABSTRACT

The semiconductor device includes a substrate, a stack structure including gate patterns and interlayer insulating films that are alternately stacked on the substrate, an insulating pillar extending in a thickness direction of the substrate within the stack structure, a polycrystalline metal oxide film extending along a sidewall of the insulating pillar between the insulating pillar and the stack structure, a liner film having a transition metal between the insulating pillar and the polycrystalline metal oxide film, and a tunnel insulating film, a charge storage film, and a blocking insulating film which are disposed in order between the polycrystalline metal oxide film and the gate patterns.

18 Claims, 20 Drawing Sheets

(51) Int. Cl.

| | | |
|---|---|---|
| H01L 27/11558 | (2017.01) | |
| H01L 27/11597 | (2017.01) | |
| H01L 27/1156 | (2017.01) | |
| H01L 27/11582 | (2017.01) | |
| H01L 27/24 | (2006.01) | |
| H01L 27/11514 | (2017.01) | |
| H01L 27/11553 | (2017.01) | |
| H01L 27/11556 | (2017.01) | |
| H01L 27/11551 | (2017.01) | |
| H01L 27/1158 | (2017.01) | |

(52) U.S. Cl.
CPC ... *H01L 27/11514* (2013.01); *H01L 27/11551* (2013.01); *H01L 27/11553* (2013.01); *H01L 27/11556* (2013.01); *H01L 27/11558* (2013.01); *H01L 27/11582* (2013.01); *H01L 27/11597* (2013.01); *H01L 27/249* (2013.01); *H01L 27/2481* (2013.01)

(58) Field of Classification Search
CPC ........... H01L 27/11558; H01L 27/1156; H01L 27/44578; H01L 27/1158; H01L 27/11582; H01L 27/11514; H01L 27/11597; H01L 27/2481; H01L 27/249
See application file for complete search history.

(56) References Cited

U.S. PATENT DOCUMENTS

| | | | | |
|---|---|---|---|---|
| 9,461,126 | B2 * | 10/2016 | Yamazaki | H01L 27/1225 |
| 9,805,805 | B1 * | 10/2017 | Zhang | H01L 27/11565 |
| 9,966,472 | B2 * | 5/2018 | Yamaguchi | B82Y 10/00 |
| 10,083,982 | B2 * | 9/2018 | Shigemura | H01L 27/11556 |
| 10,141,530 | B2 * | 11/2018 | Huang | H01L 51/107 |
| 10,256,252 | B1 * | 4/2019 | Kanazawa | H01L 27/11582 |
| 10,290,643 | B1 * | 5/2019 | Kai | H01L 27/1157 |
| 10,381,229 | B2 * | 8/2019 | Yada | H01L 27/11551 |
| 10,600,801 | B2 * | 3/2020 | Lee | H01L 29/7926 |
| 10,608,012 | B2 * | 3/2020 | Huang | H01L 29/40117 |
| 2011/0233648 | A1 | 9/2011 | Seol et al. | |
| 2014/0084357 | A1 * | 3/2014 | Choi | H01L 29/40117 257/324 |
| 2015/0279852 | A1 * | 10/2015 | Mizutani | H01L 27/11524 257/315 |
| 2016/0240683 | A1 * | 8/2016 | Miyake | H01L 27/124 |
| 2017/0213842 | A1 * | 7/2017 | Park | H01L 28/00 |

FOREIGN PATENT DOCUMENTS

| | | |
|---|---|---|
| KR | 10-2012-0056870 A | 6/2012 |
| KR | 10-2013-0137509 A | 12/2013 |
| KR | 10-2014-0046971 A | 4/2014 |
| KR | 10-2015-0103536 A | 9/2015 |
| KR | 10-2016-0139119 A | 12/2016 |
| KR | 10-2017-0097231 A | 8/2017 |
| KR | 10-2018-0020916 A | 2/2018 |
| KR | 10-2018-0046964 A | 5/2018 |

OTHER PUBLICATIONS

Korean Notice of Allowance dated Jun. 29, 2020.

* cited by examiner

Example 1

Example 2

Example 3

THIN FILM TRANSISTOR AND VERTICAL NON-VOLATILE MEMORY DEVICE INCLUDING TRANSITION METAL-INDUCED POLYCRYSTALLINE METAL OXIDE CHANNEL LAYER

CROSS-REFERENCE TO RELATED APPLICATION

Korean Patent Application No. 10-2018-0072751, filed on Jun. 25, 2018, in the Korean Intellectual Property Office, and entitled: "Thin Film Transistor and Vertical Non-Volatile Memory Device Including Transition Metal-Induced Polycrystalline Metal Oxide Channel Layer," is incorporated by reference herein in its entirety.

BACKGROUND

1. Field

Embodiments relate to a thin film transistor and a vertical non-volatile memory device including a transition metal-induced polycrystalline metal oxide channel layer.

2. Description of the Related Art

An oxide semiconductor may be used as a channel layer of a transistor. However, advances in formation of an oxide semiconductor layer are desired.

SUMMARY

Embodiments are directed to a semiconductor device, including a substrate, a stack structure including gate patterns and interlayer insulating films that are alternately stacked on the substrate, an insulating pillar extending in a thickness direction of the substrate within the stack structure, a polycrystalline metal oxide film extending along a sidewall of the insulating pillar between the insulating pillar and the stack structure, a liner film having a transition metal between the insulating pillar and the polycrystalline metal oxide film, and a tunnel insulating film, a charge storage film, and a blocking insulating film which are disposed in order between the polycrystalline metal oxide film and the gate patterns.

Embodiments are also directed to a semiconductor device, including a substrate, a liner pattern including a transition metal on the substrate, a polycrystalline metal oxide pattern on the liner pattern, an insulating film extending along a sidewall of the liner pattern, a sidewall of the polycrystalline metal oxide pattern and an upper surface of the polycrystalline metal oxide pattern, and a gate electrode on the insulating film.

Embodiments are also directed to a semiconductor device, including a transition metal oxynitride film, a conductive pattern on the transition metal oxynitride film, and a metal oxide film between the transition metal oxynitride film and the conductive pattern.

Embodiments are also directed to a semiconductor device, including a first conductive pattern extending in a first direction on a substrate, a metal oxide film extending in a thickness direction of the substrate and including a first end and a second end which are opposite to each other, the first end of the metal oxide film being connected to the first conductive pattern, an insulating film extending along a first sidewall of the metal oxide film, a liner film extending along a second sidewall opposite to the first sidewall of the metal oxide film and having a transition metal, a gate pattern spaced away from the substrate and on the insulating film, and a second conductive pattern connected to the second end of the metal oxide film on the metal oxide film.

Embodiments are also directed to a method for fabricating a semiconductor device, including sequentially forming a liner film and a metal oxide film on a substrate, the liner film including a transition metal, and being in contact with the metal oxide film, forming a liner pattern and a metal oxide pattern on the substrate by patterning the liner film and the metal oxide film, forming an insulating film extending along a sidewall of the liner pattern, a sidewall of the metal oxide pattern and an upper surface of the metal oxide pattern, and forming a gate electrode on the insulating film.

BRIEF DESCRIPTION OF THE DRAWINGS

Features will become apparent to those of skill in the art by describing in detail example embodiments with reference to the attached drawings in which.

DETAILED DESCRIPTION

Figure 1A:
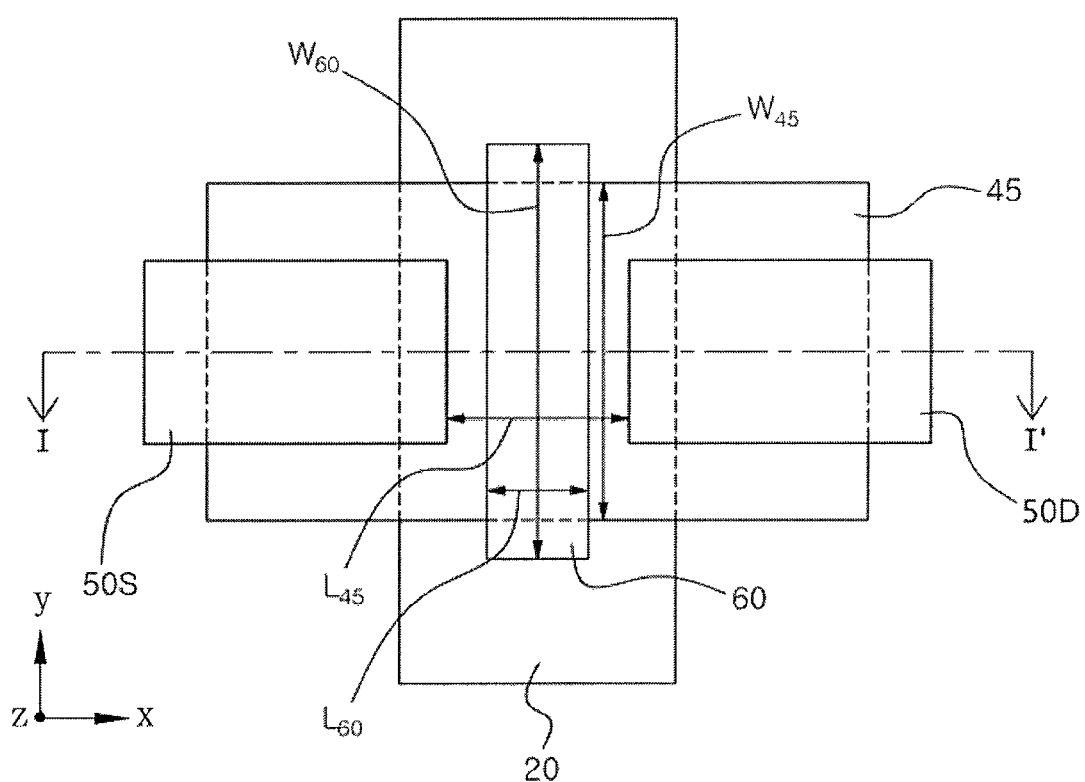
FIG. 1A illustrates a layout view of a thin film transistor according to an example embodiment.
Figure 1B:
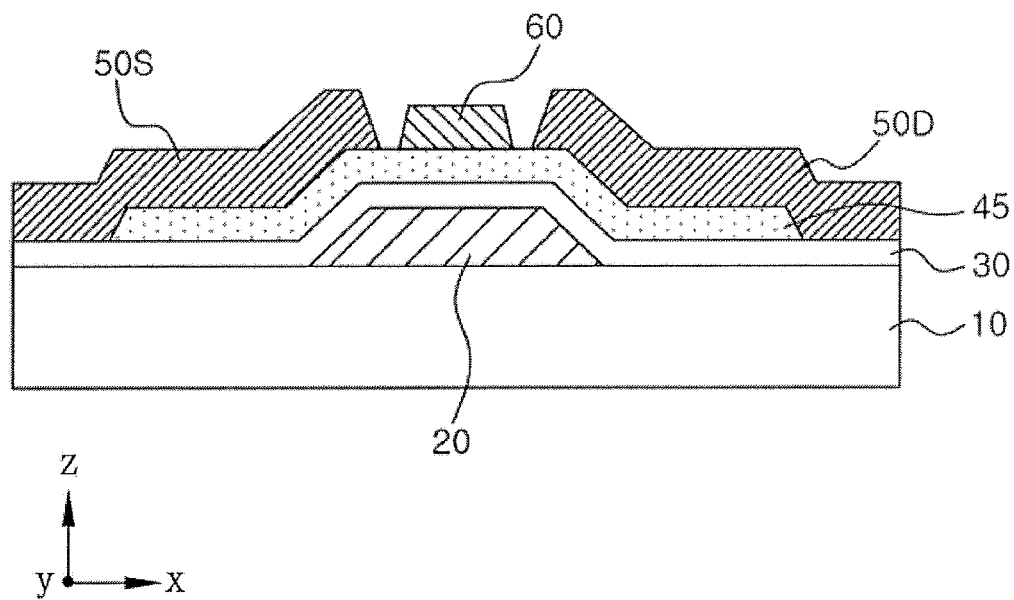
FIG. 1B is a cross sectional view cut in Line I-I'.

FIG. 1A is a layout view of a thin film transistor according to an example embodiment, and FIG. 1B is a cross sectional view cut in Line I-I';

Referring to FIGS. 1A and 1B, a substrate 10 may be provided. The substrate 10 may be a semiconductor, metal, glass, or polymer substrate. A gate electrode 20 may be formed to extend, e.g., in a first or y-direction, on the substrate 10. The gate electrode 20 may be formed by using Al, Cr, Cu, Ta, Ti, Mo, W, or an alloy thereof. A gate insulating film 30 may be formed on the gate electrode 20. The gate insulating film 30 may be a silicon oxide film, a silicon oxynitride film, an aluminum oxide film, an aluminum oxynitride film, or a combination film thereof.

A metal oxide channel layer 45 (patterned so as to lie, e.g., in a second or x-direction, across an upper portion of the gate electrode 20) may be formed on the gate insulating film 30. The metal oxide channel layer 45 may be, e.g., an In—Ga oxide layer, an In—Zn oxide layer, or an In—Ga—Zn oxide layer, and may be in an amorphous state as deposited or patterned. The metal oxide channel layer 45 may be formed by using various suitable methods, and e.g., may be formed by using a physical deposition method such as sputtering, or a chemical deposition method such as chemical vapor deposition and atomic layer deposition or the like, and further, may be patterned by using various suitable methods. The metal oxide channel layer 45 may be formed to a thickness, e.g., in a third or z-direction, of ones to dozens of nm, e.g., 10 to 50 nm, for example 10 to 30 nm.

Formation of the metal oxide channel layer 45 by using the atomic layer deposition may be performed by using an In source, an oxidant, and a Ga source and/or a Zn source, for example. For example, Trimethyl Indium ($In(CH_3)_3$; TMIn) or the like may be used as an In source, Trimethyl Gallium ($Ga(CH_3)_3$; TMGa) or the like may be used as a Ga source, and Diethyl Zinc ($Zn(C_2H_5)_2$; DEZ), Dimethyl Zinc ($Zn(CH_3)_2$; DMZ) or the like may be used as a Zn source. Further, at least one of oxygen ($O_2$), ozone ($O_3$), vapor ($H_2O$), $N_2O$, $CO_2$ or the like may be used as oxidant, for example. When the metal oxide channel layer 45 is In—Ga—Zn oxide (IGZO), a number of atoms of In may be about 20 to 80 at %, e.g., about 30 to 70 at %, compared to a number of atoms in a total of In, Ga and Zn. Within this range, In—Ga—Zn oxide (IGZO) may represent semiconductivity during an annealing process after being deposited to be described below. For example, an atomic ratio of In:Ga:Zn may be 1:1:1 or 2:2:1.

A portion of a surface of the metal oxide channel layer 45 between the source electrode 50S and the drain electrode 50D, more specifically, an overlapping region with the metal oxide channel layer 45 and the gate electrode 20, may be exposed by forming a source electrode 50S and a drain electrode 50D on end portions of both sides of the metal oxide channel layer 45. The source electrode 50S and the drain electrode 50D may be formed by using at least one metal such as aluminum (Al), neodymium (Nd), silver (Ag), chromium (Cr), titanium (Ti), tantalum (Ta), or molybdenum (Mo), or an alloy including the same, or a metal oxide conductive film such as indium tin oxide (ITO).

The substrate formed with the source/drain electrodes 50S, 50D may be post-deposition annealed. For example, after the deposition described above, annealing may be performed in an air atmosphere and at a temperature of about 300 to 500° C., e.g., about 350 to 450° C. In this case, the conductivity of the metal oxide channel layer 45 may be enhanced from a state near to insulative to semiconductive, and simultaneously, ohmic contact may be formed between the source/drain electrodes 50S, 50D and the metal oxide channel layer 45.

The patterned transition metal layer 60 may be formed, e.g., directly on the metal oxide channel layer 45 exposed between the source electrode 50S and the drain electrode 50D. The transition metal layer 60 may include a transition metal having a greater oxidation tendency compared to metals contained within the metal oxide channel layer 45. For example, the transition metal layer 60 may be Ta layer, Ti layer, or Mo layer. As another example, the transition metal layer 60 may be a transition metal nitride film including a small amount of nitrogen (e.g., a contained amount of nitrogen may be 5 to 35 at %) that is enriched with transition metal. For example, it may be TiN layer enriched with Ti, TaN layer enriched with Ta, or MoN layer enriched with Mo.

For example, when the metal oxide channel layer 45 is In—Ga—Zn oxide (IGZO), and the transition metal contained in the transition metal layer 60 is Ta, a Gibbs free energy ($\Delta G_f$) for formation of $Ta_2O_5$, which is an example of Ta oxide, may be lower than every Gibbs free energy for formation of $In_2O_3$, which is an example of In oxide, $Ga_2O_3$, which is an example of Ga oxide, and ZnO, which is an example of Zn oxide. Thus, the oxidation tendency of Ta is more than those of In, Ga, and Zn. Herein, the Gibbs free energy for formation of $In_2O_3$, $Ga_2O_3$, ZnO, and $Ta_2O_5$ are respectively −830.7, −998.3, −348.1, and −1911.2 kJ/mol.

The transition metal layer 60 may be formed to a thickness, e.g., in a the third or z-direction normal to an upper surface of the substrate 10, of, e.g., 5 to 50 nm, e.g., 20 to 30 nm. A ratio of a thickness of the metal oxide channel layer 45, e.g., in the third or z-direction, to a thickness of the transition metal layer 60, e.g., in the third or z-direction, may be 2:1 to 1:2, e.g., 1:1 to 1:1.5, for uniform crystallization of the metal oxide channel layer 45 performed thereafter. Further, the transition metal layer 60 may be formed so as to overlap, e.g., in plan view, the gate electrode 20 formed below the metal oxide channel layer 45. For example, the transition metal layer 60 may be formed to overlap a center of the gate electrode 20 or a center of a channel region of TFT.

In an implementation, the transition metal layer 60 may be formed so as not to be in contact with the source/drain electrodes 50S, 50D. For example, as shown in FIG. 1A, the transition metal layer 60 may have a length $L_{60}$, e.g., in the first or x-direction, that is shorter than a channel length $L_{45}$ of TFT, i.e., the interval between the source/drain electrodes 50S, 50D, and may substantially centered relative thereto. Crystallization (described below) may be performed in an entire width, e.g., in the second or y-direction, of the transition metal layer 60 having a width $W_{60}$, which may be as wide as or wider in the second or y-direction than a channel width of the TFT, i.e., a width $W_{45}$ of the metal oxide channel layer 45.

The resulting material may be crystallization-annealed after the transition metal layer 60 is formed. The crystallization-annealing may be performed in an oxygen or nitrogen atmosphere, and crystallization-annealing may be performed at about 150° C. to 500° C., e.g., about 200° C. to 400° C., and, e.g., about 250° C. to 400° C. or about 250° C. to 350° C.

Without being bound by theory, it is believed that, during the crystallization-annealing process, oxygen species loosely bonded with metal atoms within the metal oxide channel layer 45 near to an interface between the transition metal layer 60 and the metal oxide channel layer 45 (e.g., interstitial oxygen, hydroxyl groups, or the like) may be removed or consumed by reacting with the metal of the transition metal layer 60 to form a transition metal oxide ($M^aO_x$, where $M^a$ is metal within the transition metal layer 60). Simultaneously, electrons may be emitted into the metal oxide channel layer 45 as the transition metal oxide is formed within the transition metal layer 60. The electrons supplied to the metal oxide channel layer 45 of an interface in contact with the transition metal layer 60 may be delivered to an antibonding orbital of a metal-oxygen bond in the metal oxide channel layer 45 such that the metal-oxygen bond of the interface may be weakened. Thus, the metal-oxygen bond may be broken and then rearranged from the interface. Such rearrangement may be transferred in an internal portion of the metal oxide channel layer 45. Thus, the entire metal oxide channel layer 45 may be converted to be crystalline at a relatively lower temperature, e.g., polycrystalline. As a result, lattice fraction of metal-oxygen within the metal oxide channel layer 45 may be increased and crystallinity may be increased. Meanwhile, the crystallinity within the metal oxide channel layer 45 may become lower in a direction of an opposite surface to a surface in contact with the transition metal layer 60, i.e., in a direction of the gate insulating film 30.

The crystallized metal oxide channel layer 45 may be converted into polycrystallized metal oxide channel layer 45 including crystallized grains of a C-axis. For example, the polycrystallized metal oxide channel layer 45 may be observed at a proximity to about 33° (2θ) in an XRD spectrum, and may present a recognizable diffraction peak (009) that indicates a crystal plane oriented in C-axis. The crystallized metal oxide channel layer 45 may be formed at least within at least a portion of an interface in contact with the gate insulating film 30 so that the crystallized grains in C-axis within the amorphous matrix may be partially formed to be isolated from each other. Accordingly, charge migration may be less interrupted as grain boundaries between the crystallized grains are limited or the grain boundaries are less clear. As a result, electrical characteristics of a device including the metal oxide channel layer 45 crystallized in C-axis may be enhanced. Further, the crystallized metal oxide channel layer 45 may not show peaks indicating the (014) plane and the (015) plane, which are diffraction peaks formed in the XRD spectrum that may appear simultaneously when grain boundaries are extensive. Further, the crystallized metal oxide channel layer 45 may not show peaks that may correspond to (002) plane of ZnO or (400) phase of bixbyite $In_2O_3$.

When the crystallization-annealing is performed in an oxygen atmosphere, the transition metal layer 60 may be modified to a transition metal oxide layer (e.g., Ta oxide film, Ti oxide film, or Mo oxide film). The transition metal oxide layer is an insulating material as both a surface exposed to the oxygen atmosphere and an interface in contact with the metal oxide channel layer 45 are all oxidized. When the crystallization-annealing is performed in a nitrogen atmosphere, the transition metal layer 60 may be modified to a transition metal oxynitride layer (e.g., Ta oxynitride film, Ti oxynitride film, or Mo oxynitride film). The transition metal oxynitride layer is insulating material, as the transition metal layer 60 is oxidized near to an interface in contact with the metal oxide channel layer 45 and nitrified near to a surface exposed to the nitrogen atmosphere.

Figure 2:
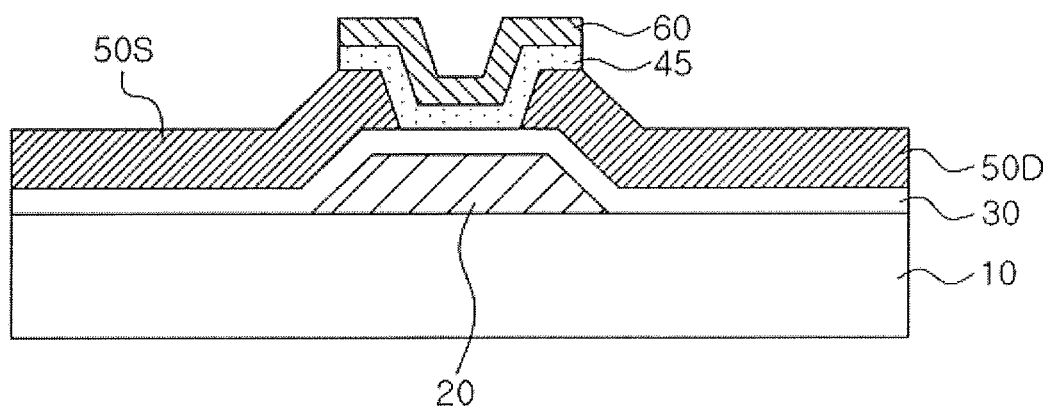
FIG. 2 illustrates a cross sectional view of a stage in a method of fabricating a thin film transistor according to an example embodiment.

FIG. 2 is a cross sectional view of a stage in a method of fabricating a thin film transistor according to an example embodiment. The fabricating method of the thin film transistor according to an example embodiment may be similar to the fabricating method of the thin film transistor described with reference to FIGS. 1A and 1B except for as described below.

Referring to FIG. 2, the gate electrode 20 extending in a first direction on the substrate 10 may be formed and the gate insulating film 30 may be formed on the gate electrode 20. The source electrode 50S and the drain electrode 50D may be formed on the gate insulating film 30. At least a portion of the gate insulating film 30 that overlaps the gate electrode 20, between the source electrode 50S and the drain electrode 50D, may be exposed such that the exposed gate insulating film 30 and the metal oxide channel layer 45 covering the source electrode 50S and the drain electrode 50D may be formed. The substrate 10 formed with the metal oxide channel layer 45 may be post-deposition annealed. The post-deposition annealing may be performed in the air atmosphere and at a temperature of about 300 to 500° C., e.g., about 350 to 450° C. In this case, the conductivity of the metal oxide channel layer 45 may be enhanced from a state near to insulative to semiconductive, and simultaneously, ohmic contact may be formed between the source/drain electrodes 50S, 50D and the metal oxide channel layer 45.

Then, the transition metal layer 60 may be formed on the metal oxide channel layer 45. Then, the metal oxide channel layer 45 and the transition metal layer 60, which are stacked and patterned in order on the gate insulating film 30, may be formed by patterning the transition metal layer and the metal oxide channel layer in order. As a result, the patterned metal oxide channel layer 45 and the transition metal layer 60 may have substantially the same width and length. The metal oxide channel layer 45 may lie across on an upper portion of the gate electrode 20, and further, may respectively connect to the source electrode 50S and the drain electrode 50D at both side end portions. Thus, the source electrode 50S and the drain electrode 50D may connect to the patterned metal oxide channel layer 45 on a lower portion of both side end portions of the metal oxide channel layer 45.

The resulting material may be crystallization-annealed in a state in which the transition metal layer 60 is deposited (patterned or not patterned). During the crystallization-annealing process, the metal oxide channel layer 45 may be crystallized as described above with reference to FIGS. 1A and 1B.

Figure 3A:
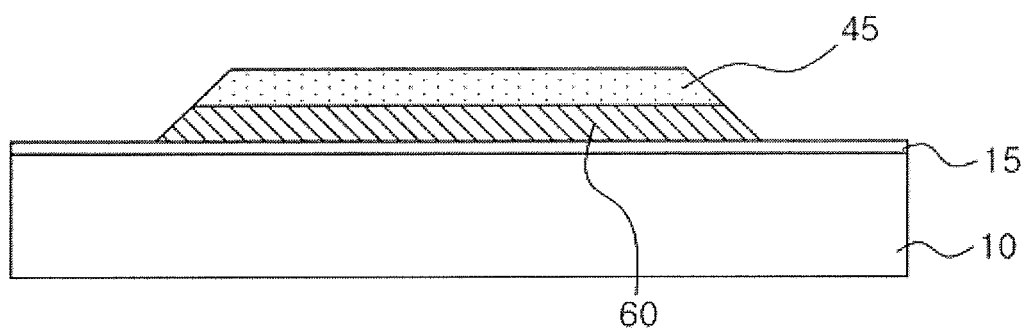
FIGS. 3A and 3B illustrate cross sectional views of stages in a method of fabricating a thin film transistor according to an example embodiment.
Figure 3B:
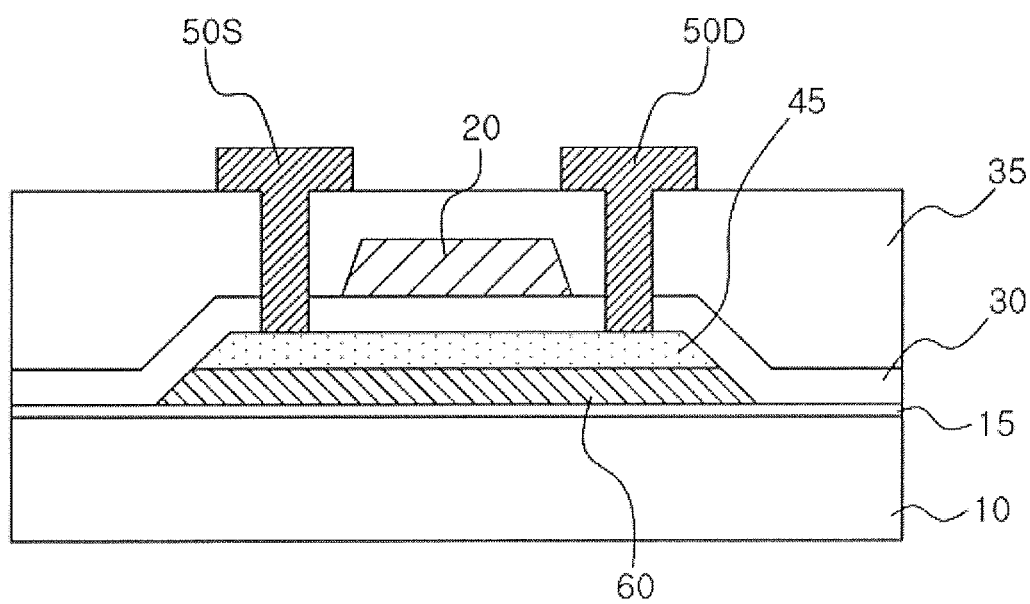

FIGS. 3A and 3B are cross sectional views of stages in a method of fabricating a thin film transistor according to an example embodiment. The fabricating method of the thin film transistor according to the present example embodiment may be performed in a similar manner to the fabricating method of the thin film transistor described with reference to FIGS. 1A and 1B except for as described below.

Referring to FIG. 3A, a buffer layer 15 may be formed on the substrate 10. The buffer layer 15 may be a silicon oxide film, a silicon oxynitride film, a silicon nitride film, or a composite film thereof.

The transition metal layer 60 and the metal oxide channel layer 45, which are stacked and patterned in order on the buffer layer 15, may be formed as the transition metal layer and the metal oxide channel layer are formed in order on the buffer layer 15 and the metal oxide channel layer and the transition metal layer are patterned in order. As a result, the patterned metal oxide channel layer 45 and the transition metal layer 60 may have substantially the same width and length as each other.

The resulting material may be crystallization-annealed in a state in which the metal oxide channel layer is deposited (patterned or not patterned). During the crystallization-annealing process, the metal oxide channel layer 45 may be crystallized as described above with reference to FIGS. 1A and 1B. However, while the crystallization-annealing process described above with reference to FIGS. 1A and 1B may be performed in oxygen or nitrogen atmosphere, the crystallization-annealing process according to an example embodiment may be performed in oxygen atmosphere, not in nitrogen atmosphere. Further, during the crystallization-annealing process, the conductivity of the metal oxide channel layer 45 may be enhanced from a state near to insulative to semiconductive, and simultaneously, may be crystallized by including crystallized grains in a C-axis. The above explanation with reference to FIGS. 1A and 1B provides explanation with respect to the crystallization-annealing.

Referring to FIG. 3B, the gate insulating film 30 may be formed on the metal oxide channel layer 45. The gate electrode 20 across an upper portion of the metal oxide channel layer 45 may be formed on the gate insulating film 30. An interlayer insulating film 35 covering the gate electrode 20 may be formed on the gate electrode 20. The interlayer insulating film 35 may be a silicon oxide film, a silicon oxynitride film, a silicon nitride film, or a composite film thereof.

Contact holes respectively exposing both side end portions of the metal oxide channel layer 45 may be formed within the interlayer insulating film 35 and the gate insulating film 30 thereunder, and the source electrode 50S and the drain electrode 50D respectively connecting to both side end portions of the metal oxide channel layer 45 may be formed within the contact holes. Then, annealing to enhance ohmic contact between the metal oxide channel layer 45 and the source/drain electrodes 50S, 50D may be performed.

Figure 4A:
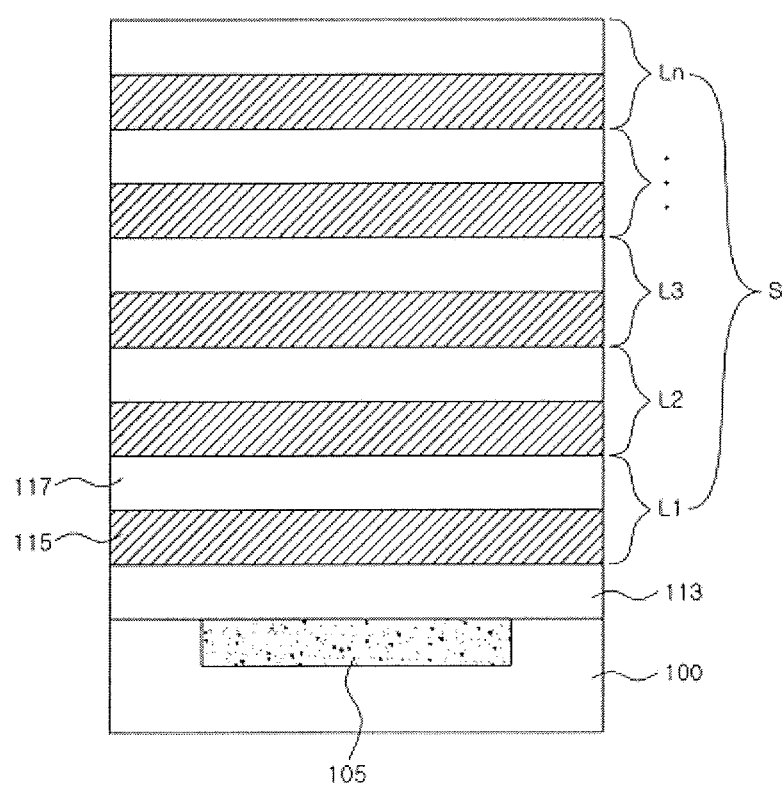
FIGS. 4A to 4F illustrate cross sectional views of stages in a method of fabricating a vertical NAND flash memory device according to an example embodiment.

FIGS. 4A to 4F are cross sectional views of stages in a method of fabricating a vertical NAND flash memory device according to an example embodiment;

Referring to FIG. 4A, a lower insulating film 113 may be formed on the substrate 100. A stack S, in which a plurality of control gate films 115 and a plurality of interlayer insulating films 117 are alternately stacked on the lower insulating film 113, may be formed. For example, n pairs of the control gate film 115 and the interlayer insulating film 117 may be stacked to form a stack including L1, L2, . . . , Ln of unit layers. The substrate 100 may include an impurity region 105 enhanced in conductivity by being doped with impurities compared to a bulk substrate. In some example embodiments, the impurity region 105 may be referred to as a common source line 105.

The substrate 100 may be a semiconductor substrate, e.g., monocrystalline silicon, an IV-IV compound such as silicon-germanium, or silicon carbide, III-V compound, or II-VI compound substrate, or a semiconductor layer formed on any of these substrates. The control gate film 115 may include a semiconductor material, e.g., doped polysilicon, or a metal, e.g., tungsten, copper, aluminum, tantalum, titanium, cobalt, nitride titanium, or an alloy thereof. The lower insulating film 113 and the interlayer insulating film 117 may be a silicon oxide film, a silicon oxynitride film, a silicon nitride film, or a combination film thereof.

Figure 4B:
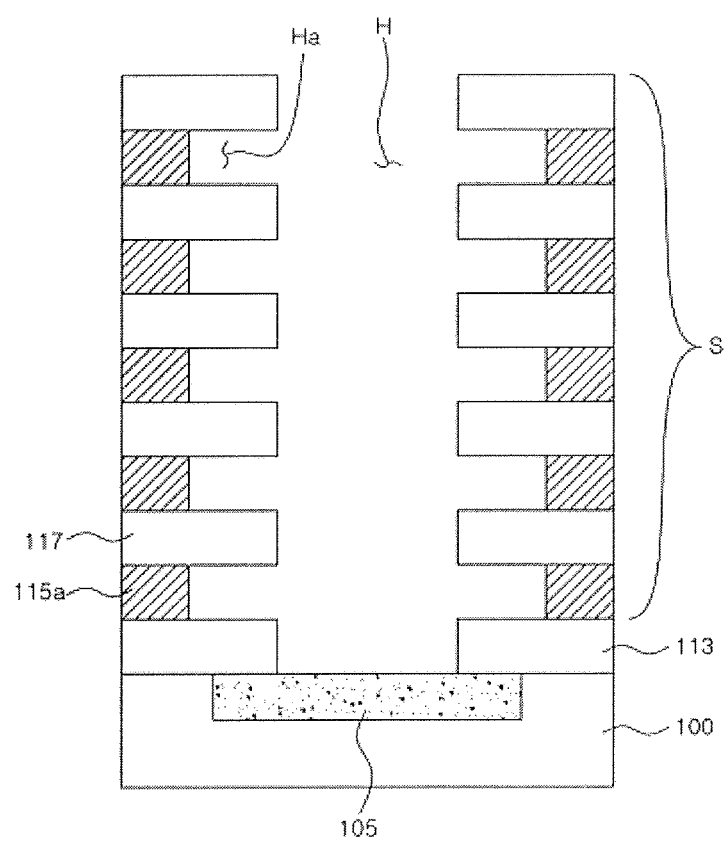

Referring to FIG. 4B, an opening portion H may be formed to penetrate through the stack (i.e., through a plurality of the control gate films 115 and a plurality of interlayer insulating films 117 which are alternately stacked) and the lower insulating film 113, and may expose the substrate 100, e.g., the impurity region 105.

Thereafter, grooves Ha may be formed (exposing control gate patterns 115a on a side portion and the insulating films 117, 113 on upper and lower portions) as the control gate films 115 exposed in a sidewall of the opening portion H are selectively recessed, thus forming the control gate patterns 115a disposed between the interlayer insulating films 117.

Figure 4C:
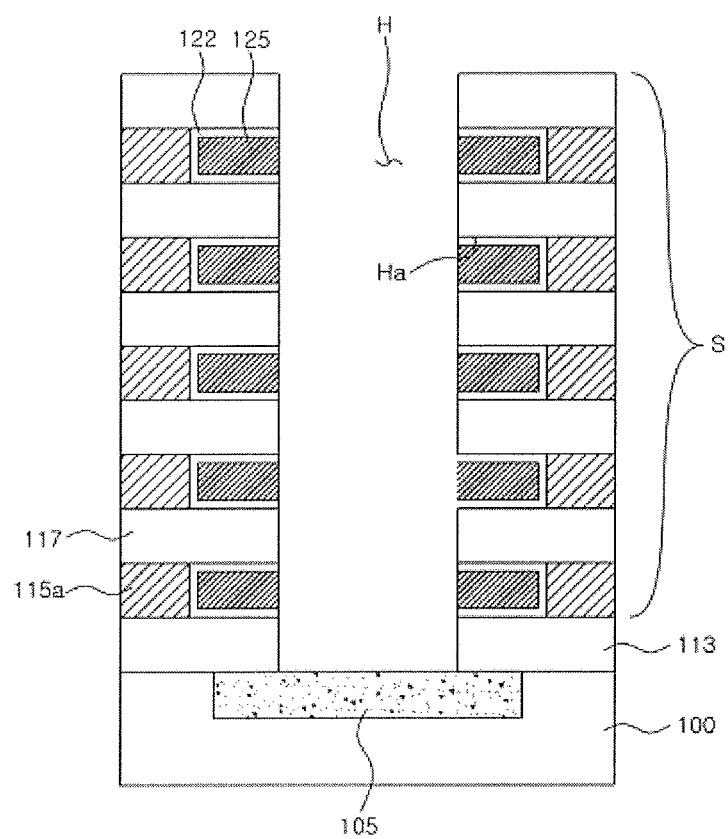

Referring to FIG. 4C, a blocking insulating film 122 may be conformally formed on an inner surface of the grooves Ha and a sidewall of the opening portion H. Then, a charge storage film 125 may be conformally formed on the blocking insulating film 122, and then the charge storage film 125 and the blocking insulating film 122 may be anisotropic-etched in order. As a result, the blocking insulating film 122 conformally coating an inner surface of the grooves Ha and the charge storage film 125 filling the grooves Ha surface-coated with the blocking insulating film 122 may be formed. The blocking insulating film 122, the charge storage film 125, and the insulating film 117, 113 may be exposed within a sidewall of the opening portion H. According to an example embodiment, the blocking insulating film 122 may be an Inter Gate Dielectric (IGD), and e.g., it may be a silicon oxide film, a silicon oxynitride film, or an aluminum oxide film having a high-k dielectric constant. According to an example, embodiment, the charge storage film 125 may be a floating gate formed of, e.g., polysilicon.

Figure 4D:
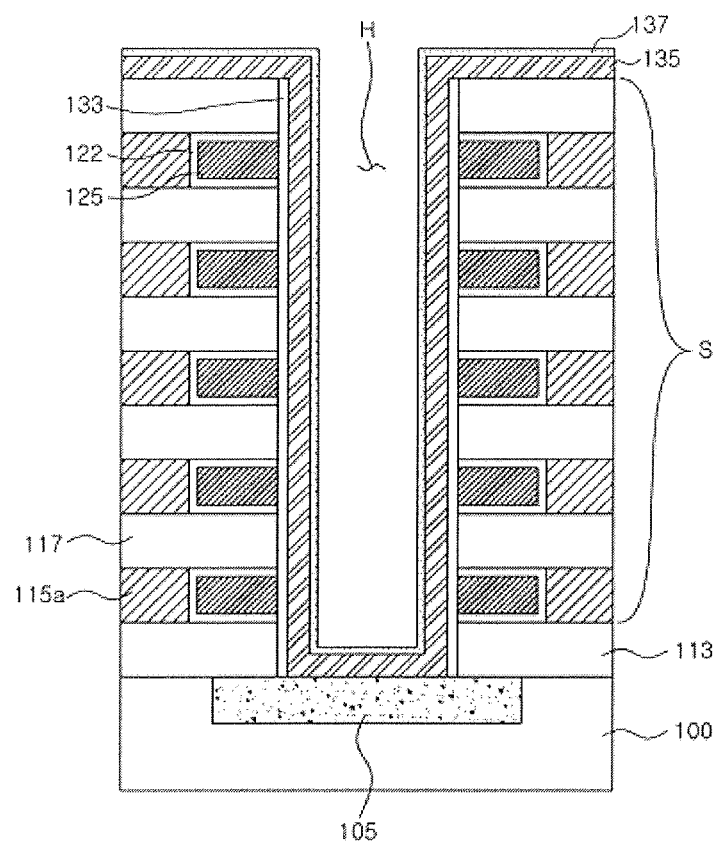

Referring to FIG. 4D, a tunnel insulating film 133 may be formed to cover the charge storage film 125 on a sidewall of the opening portion H by, e.g., anisotropic etching after a tunnel insulating film material is conformally formed on a surface including a sidewall of the opening portion H. In another implementation, the tunnel insulating film 133 may be formed by oxidizing the charge storage film 125 exposed on a sidewall of the opening portion H. The tunnel insulating film 133 may be a silicon oxide film.

The metal oxide channel layer 135 may conformally formed on a sidewall of the opening portion H formed with the tunnel insulating film 133 and the common source line 105. The metal oxide channel layer 135 may be, e.g., an In—Ga oxide layer, an In—Zn oxide layer, or an In—Ga—Zn oxide layer in an amorphous state as deposited. The metal oxide channel layer 135 may be formed by using an atomic layer deposition. The metal oxide channel layer 135 may be formed by using an atomic layer deposition, e.g., by using In source, oxidant, and Ga source and/or Zn source. For example, Trimethyl indium (In(CH$_3$)$_3$; TMIn) or the like may be used as an In source, Trimethyl gallium (Ga(CH$_3$)$_3$; TMGa) or the like may be used as a Ga source, Diethyl Zinc (Zn(C$_2$H$_5$)$_2$; DEZ), Dimethyl Zinc (Zn(CH$_3$)$_2$; DMZ) or the like may be used as a Zn source. Further, at least one of oxygen (O$_2$), ozone (O$_3$), vapor (H$_2$O), N$_2$O, CO$_2$ or the like may be used as oxidant, for example. When the metal oxide channel layer 135 is In—Ga—Zn oxide (IGZO), a number of atoms of In may be about 20 to 80 at %, e.g., about 30 to 70 at %, compared to a number of atoms in a total of In, Ga and Zn. Within this range, In—Ga—Zn oxide (IGZO) may provide semiconductivity during an annealing process after being deposited (described below). For example, atomic ratio of In:Ga:Zn may be 1:1:1 or 2:2:1.

The substrate 100 formed with the metal oxide channel layer 135 may be post-deposition annealed. The above-described post-deposition annealing may be performed in the air atmosphere and at a temperature of about 300 to 500° C., e.g., about 350 to 450° C. In this case, the conductivity of the metal oxide channel layer 135 may be enhanced from a state near to insulative to semiconductive, and simultaneously, ohmic contact may be formed between the common source line 105 and the metal oxide channel layer 135.

The transition metal layer 137 may be conformally formed on the metal oxide channel layer 135. The transition metal layer 137 may be formed by using an atomic layer deposition. The transition metal layer 137 is a layer containing transition metal, and the contained transition metal may be transition metal having a greater oxidation tendency compared to metal(s) contained within the metal oxide channel layer 135. For example, the transition metal layer 137 may be a Ta layer, Ti layer, or Mo layer. As another example, the transition metal layer 137 may be a transition metal nitride film including a small amount of nitrogen (e.g., contained amount of nitrogen is 5 to 35 at %) enriched with transition metal. For example, it may be Ti enriched with a TiN layer, Ta enriched with TaN layer, or Mo enriched with MoN layer. For example, when the metal oxide channel layer 135 is In—Ga—Zn oxide (IGZO) and the transition metal contained in the transition metal layer 137 is Ta, a Gibbs free energy (AGO for formation of Ta oxide, e.g., $Ta_2O_5$, may be lower than every Gibbs free energy for formation of In oxide, e.g., $In_2O_3$, Ga oxide, e.g., $Ga_2O_3$, and Zn oxide, e.g., ZnO, and this may indicate that Ta has greater oxidation tendency compared to In Ga. and Zn. Herein, the Gibbs free energy for formation of $In_2O_3$, $Ga_2O_3$, ZnO, and $Ta_2O_5$ are respectively −830.7, −998.3, −348.1, and −1911.2 kJ/mol.

The transition metal layer 137 may be formed to a thickness of 5 to 50 nm and may be formed by an atomic layer deposition. The transition metal layer 137 may be formed to a thickness of 20 to 30 nm, for example. A ratio of a thickness of the metal oxide channel layer 135 to a thickness of the transition metal layer 137 may be 2:1 to 1:2, e.g., 1:1 to 1:1.5, for uniform crystallization of the metal oxide channel layer performed thereafter.

The resulting material may be crystallization-annealed after the transition metal layer 137 is formed. The crystallization-annealing may be performed in an oxygen or nitrogen atmosphere and at about 150° C. to 500° C., e.g., about 200° C. to 400° C., more specifically, about 250° C. to 350° C.

During the crystallization-annealing process, oxygen species loosely bonded with metal atoms within the metal oxide channel layer 135 near to an interface between the transition metal layer 137 and the metal oxide channel layer 135 (e.g., interstitial oxygen, hydroxyl group, or the like) may be removed or consumed by reacting with metal within the transition metal layer 137 and forming the transition metal oxide ($M^aO_x$, where $M^a$ is metal within the transition metal layer 137), and electrons may be emitted into the metal oxide channel layer 135 as the transition metal oxide is formed within the transition metal layer 137. The electrons supplied to the metal oxide channel layer 135 of an interface in contact with the transition metal layer 137 may be delivered to an antibonding orbital of a metal-oxygen bond in the metal oxide channel layer 135 such that the metal-oxygen bond of the interface is weakened. Thus, the metal-oxygen bond of the interface may be broken and then rearranged from the interface. Such rearrangement may be transferred in an internal portion of the metal oxide channel layer 135, and the entire metal oxide channel layer 135 may be converted to be crystalline at a relatively lower temperature, e.g., polycrystalline. As a result, a lattice fraction of metal-oxygen within the metal oxide channel layer 135 may be increased and crystallinity may be increased. Crystallinity of the metal oxide channel layer 135 may be lower in a direction of an opposite surface to a surface in contact with the transition metal layer 137, i.e., in a direction of the tunnel insulating film 133.

The crystallized metal oxide channel layer 135 may be converted into a polycrystallized metal oxide channel layer 135 including crystallized grains of a C-axis. For example, the polycrystallized metal oxide channel layer 135 may be observed at a proximity to about 33° (2θ) in an XRD spectrum, and may present a recognizable diffraction peak (009) that indicates a crystal plane oriented in a C-axis. The crystallized metal oxide channel layer 135 may be formed at least within at least a portion of an interface in contact with the tunnel insulating film 133 so that C-axis-crystallized grains within amorphous matrix may be partially formed to be isolated from each other. Accordingly, charge migration may be less interrupted as grain boundaries are limited between the crystallized grains or grain boundaries are less clear. As a result, electrical characteristics of a device including the metal oxide channel layer 135 crystallized in a C-axis may be enhanced. Further, the crystallized metal oxide channel layer 135 may not show peaks of the (014) plane and the (015) plane (which are diffraction peaks that may appear as grain boundaries become extensive) in the XRD spectrum. Further, the crystallized metal oxide channel layer 135 may not show peaks that may correspond to (002) plane of ZnO or (400) phase of bixbyite $In_2O_3$.

When the crystallization-annealing is performed in an oxygen atmosphere, the transition metal layer 137 may be modified to a transition metal oxide layer (e.g., Ta oxide film, Ti oxide film, or Mo oxide film), which is an insulating material, as both a surface exposed to the oxygen atmosphere and an interface in contact with the metal oxide channel layer 135 are all oxidized. When the crystallization-annealing is performed in a nitrogen atmosphere, the transition metal layer 137 may be modified to a transition metal oxynitride layer (e.g., Ta oxynitride film, Ti oxynitride film, or Mo oxynitride film), which is insulating material, as the transition metal layer 137 is oxidized near to an interface in contact with the metal oxide channel layer 135 and nitrified near to a surface exposed to the nitrogen atmosphere.

Figure 4E:
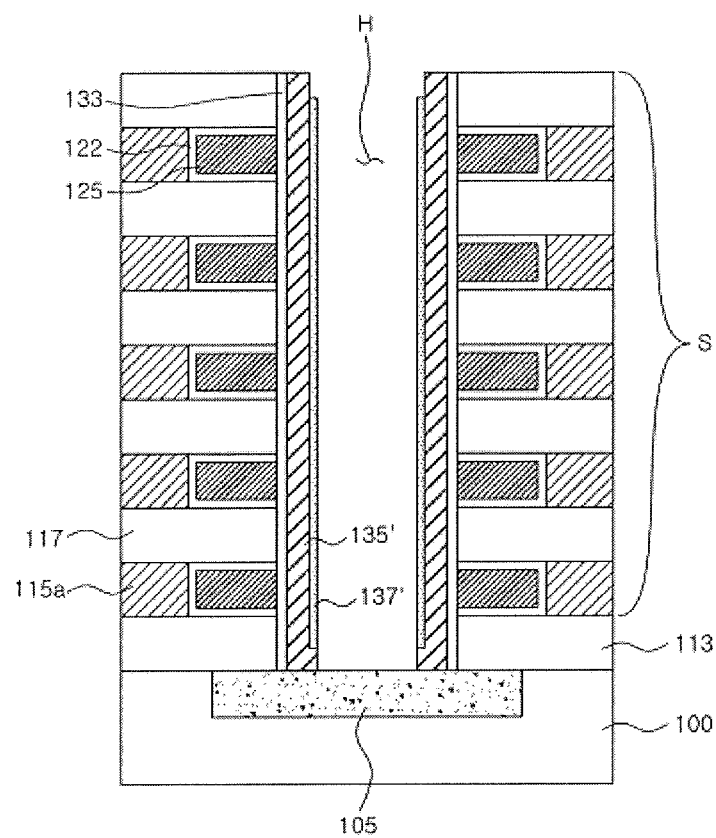

Referring to FIG. 4E, the oxidized or oxynitrified transition metal layer 137 and the metal oxide channel layer 135 may be anisotropic-etched in to form the patterned metal oxide channel layer 135' and the oxidized or oxynitrified transition metal layer 137' (which are stacked in order on the tunnel insulating film 133 formed on a sidewall of the opening portion H) and simultaneously expose the common source line 105 within the opening portion H. After the patterned metal oxide channel layer 135' is formed, the oxidized or oxynitrified transition metal layer 137' may be additionally anisotropic-etched. As a result, a region where the metal oxide channel layer 135' is exposed may be produced without being covered with the transition metal layer 137' at a gate of the opening portion H. The crystallization-annealing described with reference to FIG. 4D may be performed after the anisotropic-etching. As described above, the transition metal layer 137' may be oxidized or oxynitrified into insulating pattern in the crystallization-annealing process.

Figure 4F:
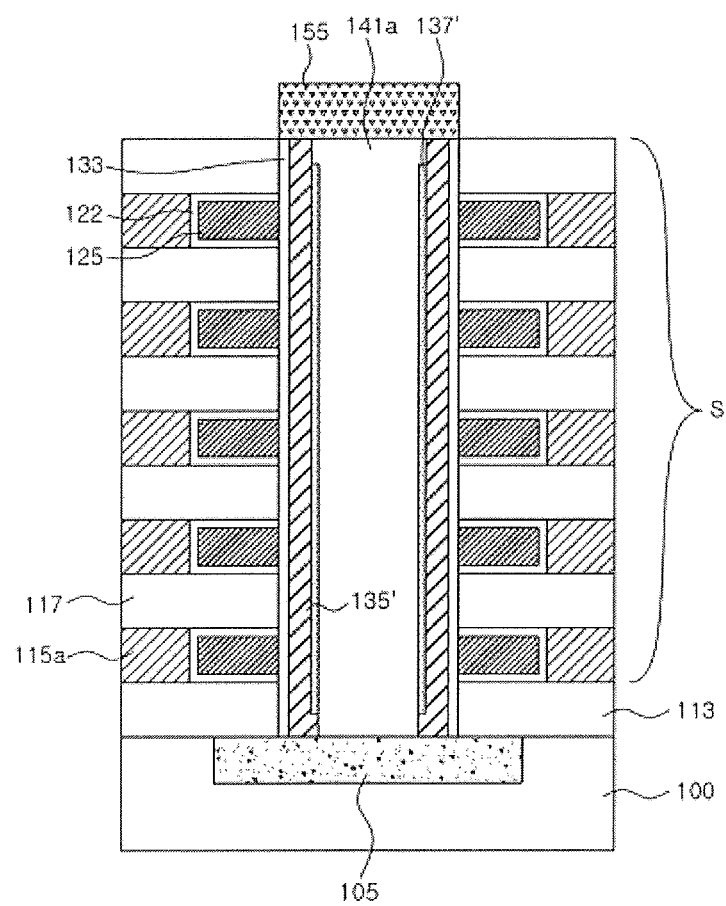

Referring to FIG. 4F, the opening portion H (formed with the metal oxide channel layer 135' and the oxidized or oxynitrified transition metal layer 137') may be filled with a buried insulating layer, and this buried insulating layer may be planarization-etched. Accordingly, an insulating pillar 141a and an upper ending portion of the metal oxide channel layer 135' surrounding the insulating pillar 141a may be exposed simultaneously when an upper plane of the stack S is exposed. Thus, an upper electrode 155 covering the insulating pillar 141a and the metal oxide channel layer 135' may be formed. The upper electrode 155 may be a bit line or a conductive pad connecting to the bit line.

In FIG. 4F, a structure of a vertical non-volatile memory device according to an example embodiment is described. The vertical non-volatile memory device according to an example embodiment may include an insulating pillar 141a extending in a direction of an upper portion of the substrate 100. The interlayer insulating films 117 and the control gate patterns 115a may be disposed to be stacked alternately on a side portion of the insulating pillar 141a. There oxidized or oxynitrified transition metal layer 137' and the polycrystalline metal oxide channel layer 135' may be disposed to be stacked in order on the insulating pillar 141a between the insulating pillar 141a and the control gate patterns 115a and extend along the insulating pillar 141a. For example, a sidewall of the insulating pillar 141a may be disposed to be wrapped with the oxidized or oxynitrified transition metal layer 137', and the polycrystalline metal oxide channel layer 135' on the oxidized or oxynitrified transition metal layer 137' may be disposed to wrap a sidewall of the insulating pillar 141a.

The tunnel insulating film 133, the charge storage film 125, and the blocking insulating film 122 may be disposed in order between the polycrystalline metal oxide channel layer 135' and each of the control gate patterns 115a. In an example embodiment, a horizontal width in parallel with a substrate surface of the control gate patterns 115a may be narrower than a horizontal width of the interlayer insulating films 117 positioned on the upper and lower portion. Accordingly, grooves Ha (which expose the control gate pattern 115a on a side portion and expose the interlayer insulating film 117 on the upper and lower portion) may be defined between the interlayer insulating films 117. The blocking insulating film 122 may conformally coat an inner surface of the grooves Ha. The charge storage film 125 may fill the grooves Ha that are conformally coated with the blocking insulating film 122. The tunnel insulating film 133 may cover the charge storage film 125.

FIGS. 5A to 5D are cross sectional views of stages in a method of fabricating a vertical NAND flash memory device according to an example embodiment. The fabricating method of the device according to an example embodiment may be similar to the fabricating method of the device described above with reference to FIGS. 4A to 4F except for as described below.

Figure 5A:
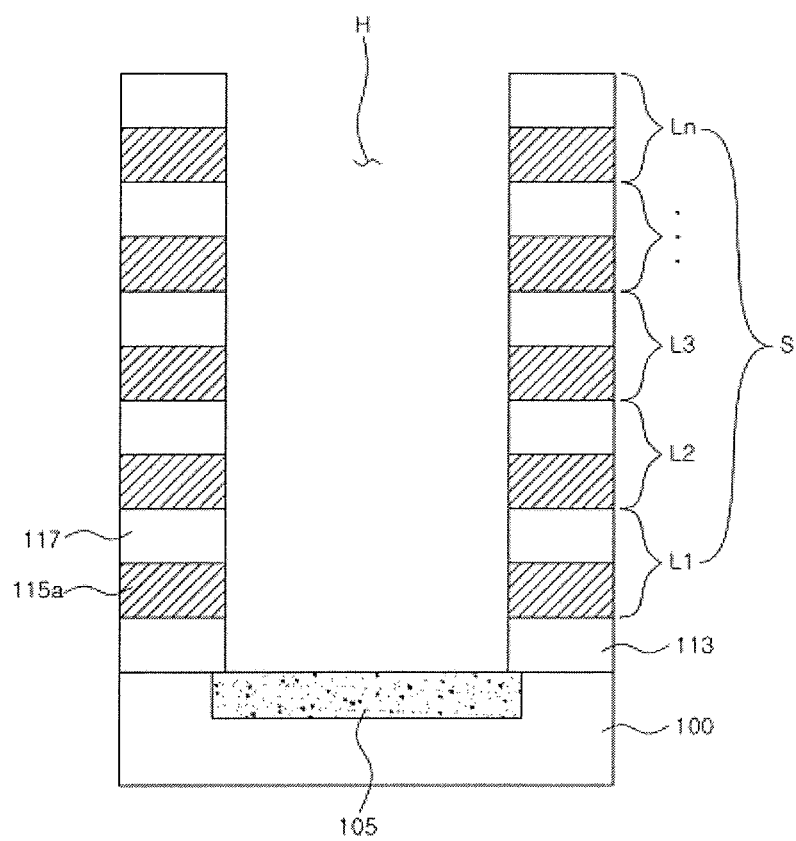
FIGS. 5A to 5D illustrate cross sectional views of stages in a method of fabricating a vertical NAND flash memory device according to an example embodiment.

Referring to FIG. 5A, a lower insulating film 113 may be formed on the substrate 100. A stack S, in which a plurality of control gate films 115 and a plurality of interlayer insulating films 117 are alternately stacked, may be formed on the lower insulating film 113. For example, n pairs of the control gate film 115 and the interlayer insulating film 117 may be stacked to form a stack including L1, L2, . . . , Ln of unit layers. The substrate 100 may include an impurity region 105 enhanced in conductivity by being doped with impurities compared to a bulk substrate. The impurity region 105 may be a common source line.

An opening portion H may be formed to penetrate through the stack (i.e., a plurality of the control gate films 115 and a plurality of interlayer insulating films 117 which are alternately stacked) and lower insulating films 113 and expose the substrate 100, e.g., the impurity region 105 within a bottom surface. With formation of the opening portion H, the control gate pattern 115a interposed between the insulating films 117, 113 may be defined, and the control gate pattern 115a may be exposed within a sidewall of the opening portion H.

Figure 5B:
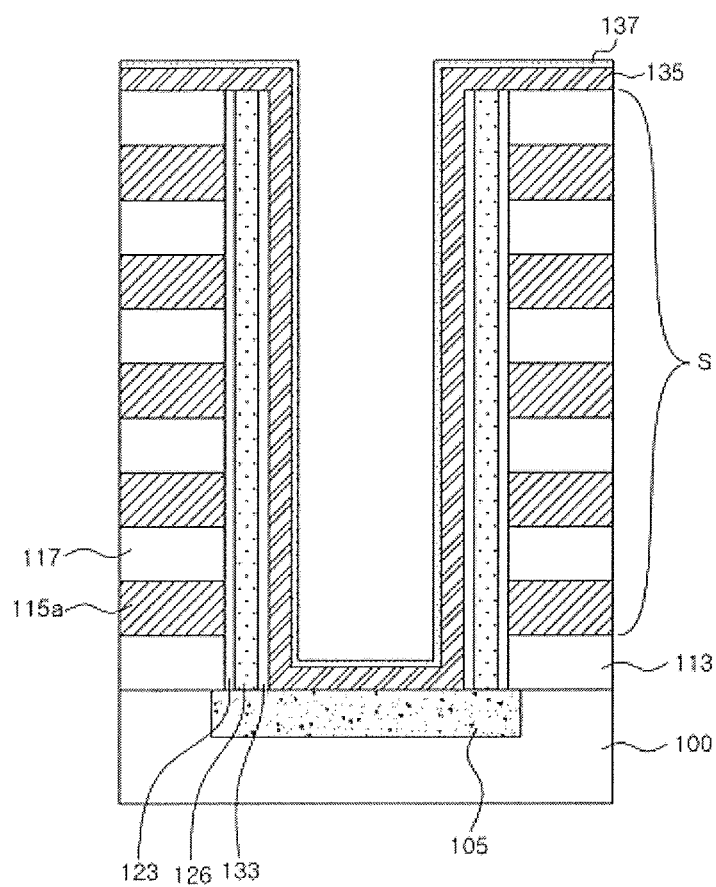

Referring to FIG. 5B, a blocking insulating film 123, a charge storage film 126, and the tunnel insulating film 133 may be conformally formed along a surface profile on the substrate 100 having the control gate pattern 115a exposed within a sidewall of the opening portion H, and may be anisotropic-etched. As a result, the blocking insulating film 123, the charge storage film 126, and the tunnel insulating film 133, which are stacked in order on a sidewall of the opening portion H, may be formed. According to an example embodiment, the charge storage film 126 may be a silicon nitride film. The blocking insulating film 123 may be a silicon oxide film, a silicon oxynitride film, or an aluminum oxide film having a high-k dielectric constant. The tunnel insulating film 133 may be a silicon oxide film.

The metal oxide channel layer 135 may be conformally formed on a sidewall of the opening portion H formed with the tunnel insulating film 133 and the common source line 105. The substrate 100 formed with the metal oxide channel layer 135 may be post-deposition annealed. The transition metal layer 137 may be conformally formed on the metal oxide channel layer 135. After the transition metal layer 137 is formed, the resulting material may be crystallization-annealed. The metal oxide channel layer 135, the post-deposition annealing, the transition metal layer 137, and the crystallization-annealing may be same as the described above with reference to FIG. 4D. The metal oxide channel layer 135 may be crystallized with the above crystallization-annealing and may be modified to the polycrystalline metal oxide channel layer 135 including crystallized grains in a C-axis, and further, the transition metal layer 137 may be oxidized or oxynitrified and modified to transition metal oxide or transition metal oxynitride, which is an insulating material.

Figure 5C:
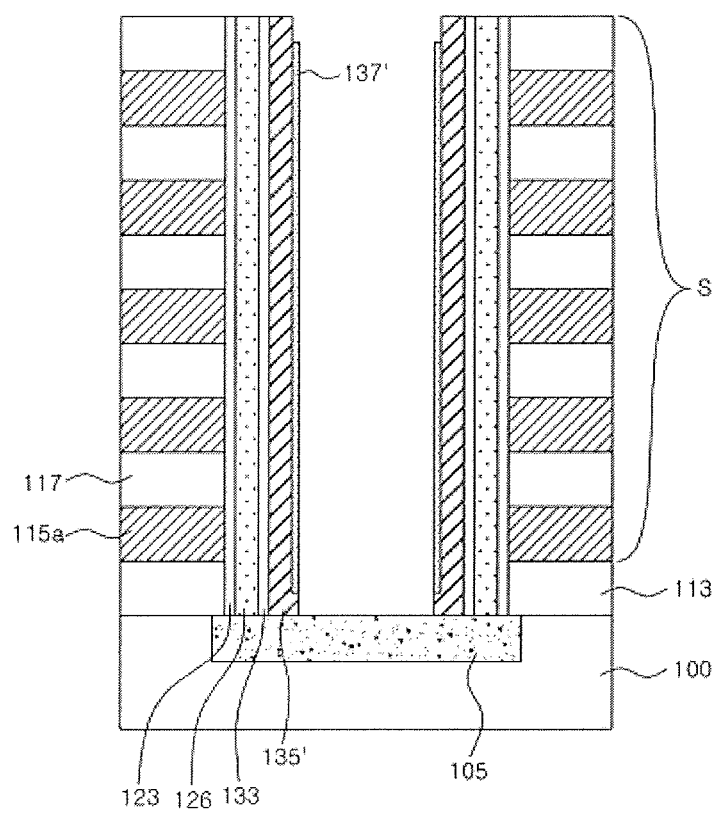

Referring to FIG. 5C, as the transition metal layer 137 and the metal oxide channel layer 135 are anisotropically etched, the patterned metal oxide channel layer 135' and the oxidized or oxynitrified transition metal layer 137' (which are stacked in order on the tunnel insulating film 133 formed on a sidewall of the opening portion H) may be formed simultaneously when the common source line 105 is exposed within the opening portion H. After the patterned metal oxide channel layer 135' is formed, the oxidized or oxynitrified transition metal layer 137' may be additionally anisotropically etched. As a result, a region where the metal oxide channel layer 135' is exposed may be produced without being covered with the transition metal layer 137' at a gate of the opening portion H. The crystallization-annealing described with reference to FIG. 5B may be performed after the anisotropic etching. As described above, the transition metal layer 137' may be an oxidized or oxynitrified into insulating pattern in the crystallization-annealing process.

Figure 5D:
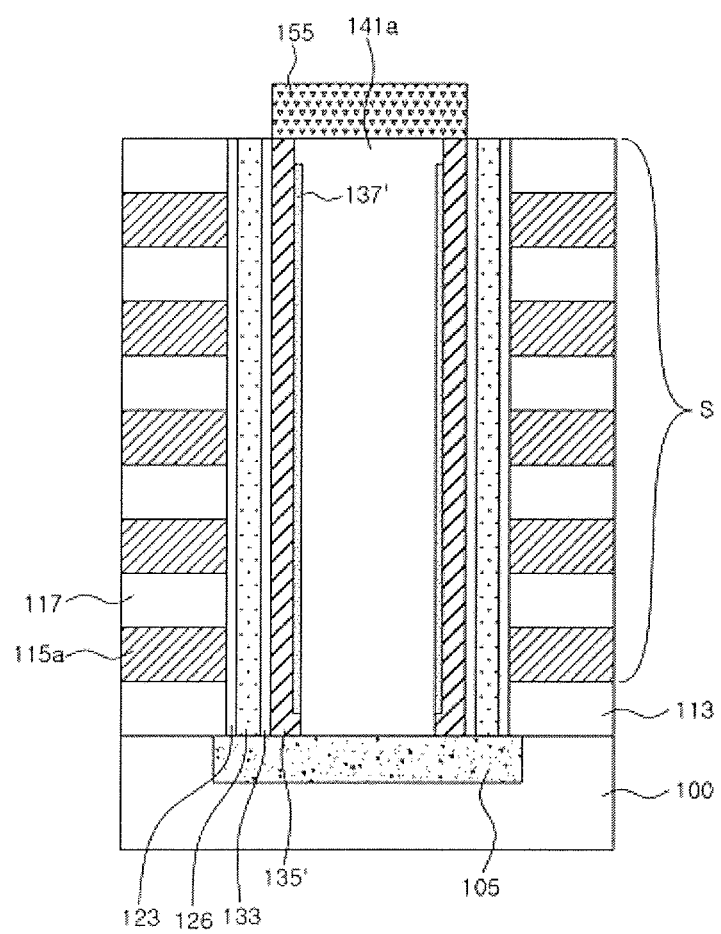

Referring to FIG. 5D, as the opening portion H (formed with the metal oxide channel layer 135' and the oxidized or oxynitrified transition metal layer 137') is filled with the buried insulating film and the buried insulating film is planarization-etched, an upper portion of the stack S may be exposed simultaneously when the insulating pillar 141a and an upper ending portion of the metal oxide channel layer 135' surrounding the insulating pillar 141a are exposed. Further, an upper electrode 155, which covers the insulating pillar 141a and the metal oxide channel layer 135' exposed with an upper portion as surrounding the insulating pillar, may be formed. The upper electrode 155 may be a bit line or a conductive pad connecting to the bit line.

In FIG. 5D, a structure of a vertical non-volatile memory device according to an example embodiment is described. The vertical non-volatile memory device according to an example embodiment may include an insulating pillar 141a extending in a direction of an upper portion of the substrate 100. The interlayer insulating films 117 and the control gate patterns 115a may be disposed to be stacked alternately on a side portion of the insulating pillar 141a. The oxidized or oxynitrified transition metal layer 137' and the polycrystalline metal oxide channel layer 135' may be disposed to be stacked in order on the insulating pillar 141a between the insulating pillar 141a and the control gate patterns 115a, and may extend along the insulating pillar 141a. For example, a sidewall of the insulating pillar 141a may be disposed to be wrapped with the oxidized or oxynitrified transition metal layer 137', and the polycrystalline metal oxide channel layer 135' on the oxidized or oxynitrified transition metal layer 137' may be disposed to wrap a sidewall of the insulating pillar 141a.

Between the polycrystalline metal oxide channel layer 135' and the control gate pattern 115a, the tunnel insulating film 133, the charge storage film 126, and the blocking insulating film 123 may be disposed in order. The tunnel insulating film 133, the charge storage film 126, and the blocking insulating film 123 may be disposed to extend in a region between the polycrystalline metal oxide channel layer 135' and the interlayer insulating films 117. Thus, the tunnel insulating film 133, the charge storage film 126, and the blocking insulating film 123 may be disposed to wrap a sidewall of the insulating pillar 141a on the polycrystalline metal oxide channel layer 135'.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Examples 1-8: TFT Fabrication

A 100 nm $SiO_2$ layer was grown on a p-type of Si wafer by thermally oxidizing a p-type Si wafer. A 15 nm amorphous IGZO (In:Ga:Zn=1:1:1 at %) semiconductor pattern was deposited on the $SiO_2$ layer by RF sputtering in an Ar atmosphere and using a shadow mask. The RF power was 100 W, and a chamber pressure was 3 mTorr. ITO source/drain electrodes were formed on both side end portions of the semiconductor pattern by disposing a shadow mask on the semiconductor pattern, and depositing ITO in utilization of DC sputtering under Ar atmosphere. The DC power was 50 W, and operation pressure was 5 mTorr. A width of the semiconductor pattern was 1000 μm and an exposed length of the semiconductor pattern between the source/drain electrodes was 300 μm. Then, the post-deposition annealing (PDA) was performed in $O_2$ atmosphere at 400° C. for one hour. A 20 nm of Ta layer was formed by sputtering using a shadow mask on the semiconductor pattern exposed between the source/drain electrodes. A width of Ta layer was 2300 μm (which was greater than a width of the semiconductor pattern), and a length of Ta layer was 150 μm (which was less than an exposed length of the semiconductor pattern between the source/drain electrodes). A plurality of such samples were fabricated and crystallization-annealed for one hour in different temperatures and atmospheres. Crystallization-annealing conditions of the samples are summarized in Table 1 below.

Comparative Examples 1-4

TFTs were fabricated in the similar manner to the examples except for that a Ta layer was not formed, and the crystallization-annealing conditions are summarized in Table 1 below.

Comparative Example 5

A TFT was fabricated in the similar manner to the examples except for that a Ta layer was not formed and the crystallization-annealing was not performed.

TABLE 1

| | Formation of Ta layer | Crystallization annealing atmosphere | Crystallization annealing temperature |
|---|---|---|---|
| Example 1 | O | $O_2$ | 200° C. |
| Example 2 | O | $O_2$ | 300° C. |
| Example 3 | O | $O_2$ | 400° C. |
| Example 4 | O | $O_2$ | 500° C. |
| Example 5 | O | $N_2$ | 200° C. |
| Example 6 | O | $N_2$ | 300° C. |
| Example 7 | O | $N_2$ | 400° C. |
| Example 8 | O | $N_2$ | 500° C. |
| Comparative Example 1 | X | $O_2$ | 400° C. |
| Comparative Example 2 | X | $O_2$ | 700° C. |
| Comparative Example 3 | X | $N_2$ | 400° C. |
| Comparative Example 4 | X | $N_2$ | 700° C. |
| Comparative Example 5 | X | Second annealing not performed | |

In the Table 1, a small amount of the air may be included within the crystallization-annealing atmosphere.

Figure 6A:
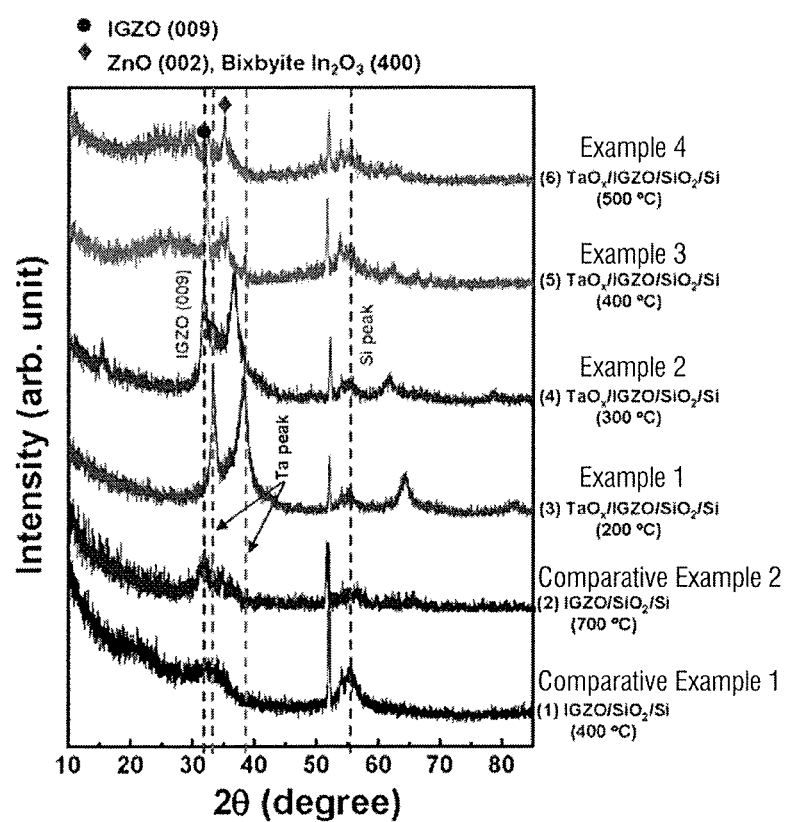
FIG. 6A illustrates X-ray diffraction (XRD) spectra with respect to Ta/IGZO/$SiO_2$/Si stack section of TFT according to Examples 1 to 4 and IGZO/$SiO_2$/Si stack section of TFT according to Comparative Examples 1 and 2.

FIG. 6A illustrates X-ray diffraction (XRD) spectra with respect to Ta/IGZO/$SiO_2$/Si stack portion of TFT according to Examples 1 to 4 and IGZO/$SiO_2$/Si stack portion of TFT according to Comparative Examples 1 and 2.

Figure 6B:
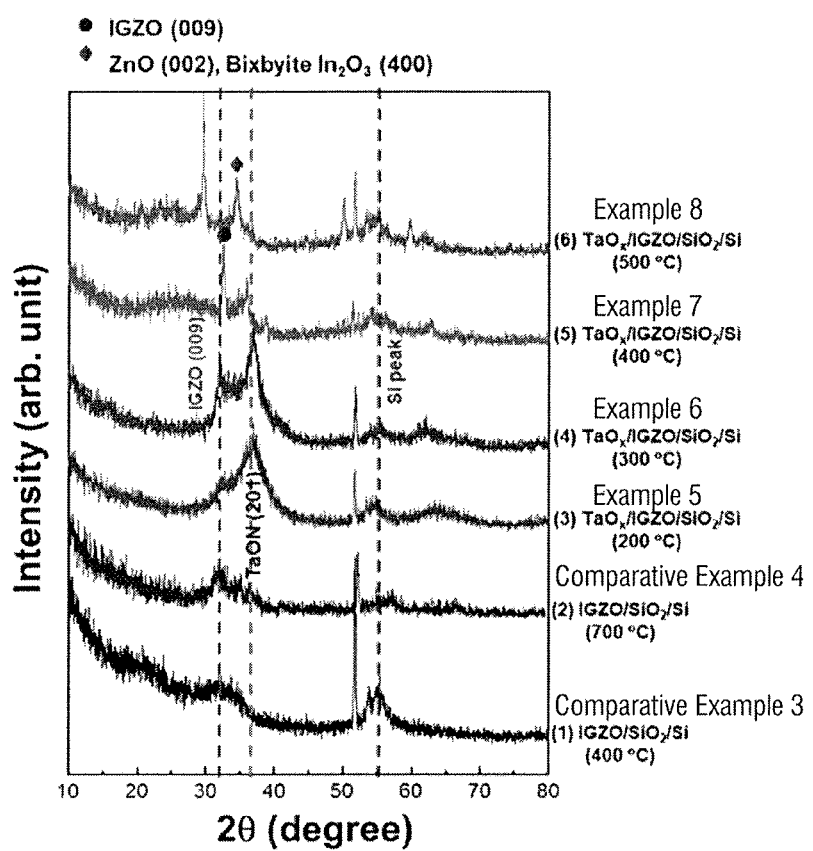
FIG. 6B illustrates XRD spectra with respect to Ta/IGZO/$SiO_2$/Si stack section of TFT according to Examples 5 to 8 and IGZO/$SiO_2$/Si stack section of TFT according to Comparative Examples 3 and 4.

FIG. 6B illustrates XRD spectra with respect to Ta/IGZO/$SiO_2$/Si stack portion of TFT according to Examples 5 to 8 and IGZO/$SiO_2$/Si stack portion of TFT according to Comparative Examples 3 and 4.

XRD analysis was conducted in step scan mode in which step size (2θ) was 0.02°, and 0.3 second per step and Cu-Kα radiation (40 kV, 30 mA) were used.

Referring to FIGS. 6A and 6B, an XRD peak at a proximity to 56°, which appears in every sample, is caused from Si substrate. An IGZO/$SiO_2$/Si stack which is annealed in oxygen or nitrogen atmosphere at 400° C. according to Comparative Examples 1 and 3 shows broad pattern only, without a pointed diffraction peak at a proximity to about 33°, which indicates that the IGZO layer remained amorphous. The XRD spectrum of an IGZO/$SiO_2$/Si stack annealed in oxygen or nitrogen atmosphere at 700° C. according to Comparative Examples 2 and 4 shows a recognizable diffraction peak (009), which indicates that IGZO layer is crystallized.

Referring to FIG. 6A, when annealing is performed at 200° C. (Example 1) among Ta/IGZO/$SiO_2$/Si stack according to Examples 1 to 4 in which Ta layer is applied to the amorphous IGZO layer and annealing is performed at 200 to 500° C. in oxygen atmosphere, strong diffraction peaks appear at 33.7° and 38.5°, which respectively show (002) and (110) planes of a tetragonal β-Ta layer. Further, when 300° C. annealing (Example 2) was performed, the peaks showing a Ta layer are shifted at a lower angle (which indicates an increase of distance between lattices because of increased thermal stress within Ta layer) and clear peak is observed at a proximity to 33° (which may be caused when a (009) plane of IGZO which is crystalline plane oriented in a C-axis).

From the above result, it may be analyzed that lattice arrangement and partial crystallization according to the lattice arrangement are generated on an interface of Ta/IGZO when 300° C.-annealing is performed (Example 2). In a state in which Ta layer is not formed, IGZO layer is not crystallized even after 400° C. annealing is performed (Comparative Example 1), and IGZO layer is crystallized at last after 700° C. annealing is performed (Comparative Example 2). Meanwhile, when Ta layer is formed on IGZO layer, it was confirmed that the IGZO layer was crystallized even at a lower temperature of 300° C., and from the result, it can be seen that when a Ta layer is formed on an IGZO layer, crystallization temperature of IGZO layer may be significantly lowered.

Further, when a Ta layer is applied to the amorphous IGZO layer and annealed at 400° C. in oxygen atmosphere (Example 3), IGZO (014), (015) peaks appear together with a pointed IGZO (009) peak, which indicates that IGZO layer is in a well-defined crystalline state. Simultaneously, metal Ta peaks do not appear anymore, which indicates that Ta layer is oxidized as being annealed within $O_2$ atmosphere and modified to $TaO_x$ layer. When Ta layer is applied to the amorphous IGZO layer and annealed at 500° C. (Example 4), the size of IGZO peaks decreases, and a pointed peak at 35° that can correspond to (002) plane of ZnO or (400) phase of bixbyite $In_2O_3$ appears, which indicates that, at high annealing temperature, a bond between cations becomes weaker rather than rearrangement into crystalline grain of $InGaZnO_4$, and small grains of ZnO or $In_2O_3$ are formed.

Referring to FIG. 6B again, when annealing is performed at 200° C. (Example 5) among $Ta/IGZO/SiO_2/Si$ stack according to Examples 5 to 8 in which Ta layer is applied to the amorphous IGZO layer and annealing is performed at 200 to 500° C. in nitrogen atmosphere, a peak showing TaON (201) plane is confirmed. Further, when annealing is performed at 300° C. (Example 6), a peak, which is observed at a proximity to 33° together with a peak showing (201) plane of TaON and caused from (009) plane of IGZO, is confirmed. From this result, like when annealing is performed at 300° C. in an oxygen atmosphere (Example 2), when annealing is performed at 300° C. in a nitrogen atmosphere (Example 6), it may be seen that lattice arrangement at an interface of Ta/IGZO and partial crystallization thereof are generated. Further, generation of peaks showing TaON (201) plane from Ta layer when annealed in nitrogen atmosphere may be seen to be oxynitrification of Ta layer because of oxygen supplied from IGZO layer and the air and nitrogen supplied from the annealing atmosphere.

As described above, when Ta layer is formed on IGZO layer, it is confirmed that the IGZO layer is crystallized even at a relatively lower temperature of 300° C. not only in oxygen atmosphere but also in nitrogen atmosphere, such that a crystallization temperature is significantly lowered with Ta layer.

Further, when a Ta layer is applied to the amorphous IGZO layer and annealed at 400° C. in nitrogen atmosphere (Example 7), intensity of an IGZO (009) peak becomes greater, which means the IGZO layer is in a well-defined crystalline state. When a Ta layer is applied to the amorphous IGZO layer and annealed at 500° C. in nitrogen atmosphere (Example 8), a size of IGZO peaks decreases, and a pointed peak at 35° corresponding to (002) plane of ZnO or (400) phase of bixbyite $In_2O_3$ appears, and this result represents that bond between cations becomes weak at high annealing temperature rather than rearrangement of crystalline grains of $InGaZnO_4$, and small grains of ZnO or $In_2O_3$ are formed. Simultaneously, TaON (201) peaks do not appear anymore, which indicates that the Ta layer is further nitrified as being annealed within $N_2$ atmosphere and modified to $TaN_x$ layer.

Figure 7A:
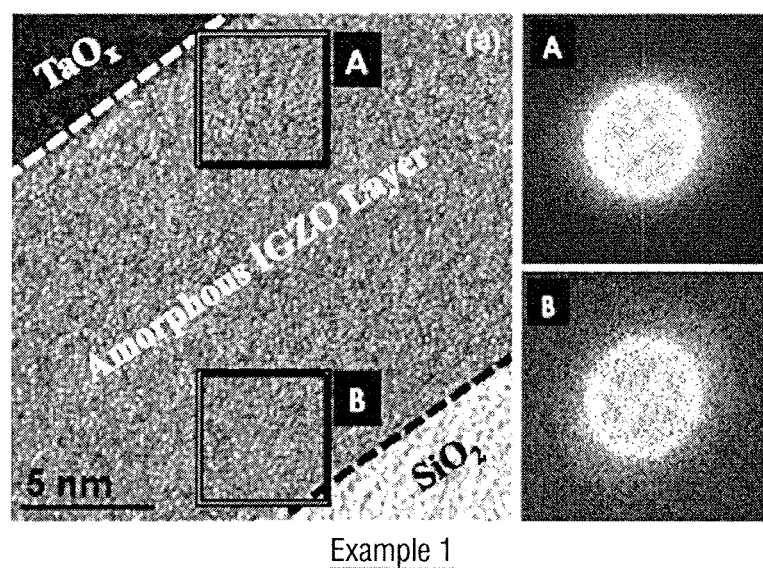
FIGS. 7A, 7B, and 7C illustrate transmission electron microscopy (TEM) images and selected area electron diffraction (SAED) patterns of cross sections with respect to TaOx/IGZO/$SiO_2$/Si stacks of TFT formed according to Examples 1 to 3.
Figure 7B:
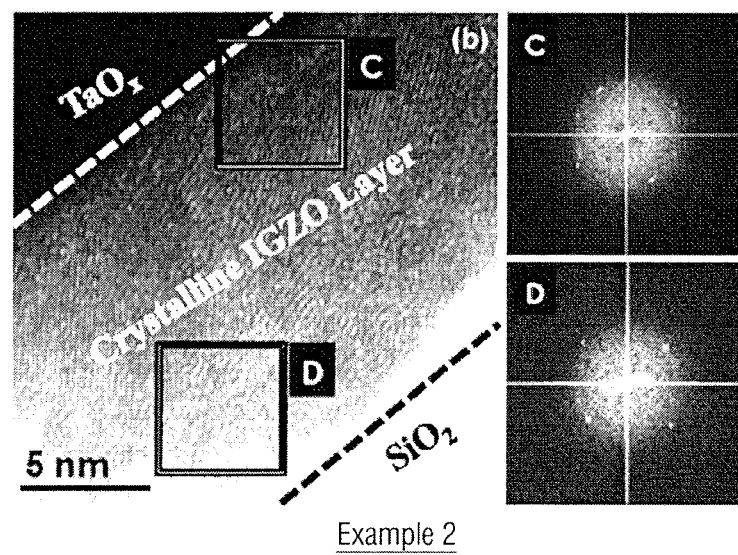
Figure 7C:
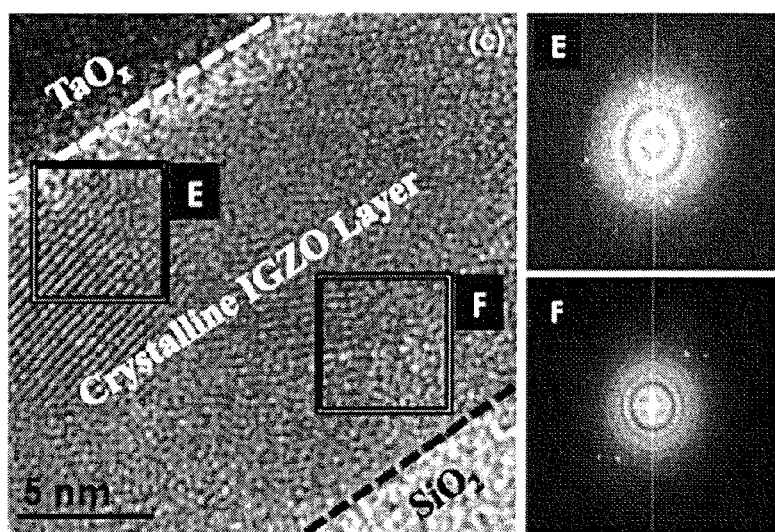

FIGS. 7A, 7B, and 7C illustrate cross sectional transmission electron microscopy (TEM) images and selected area electron diffraction (SAED) patterns of $TaOx/IGZO/SiO_2/Si$ stacks of TFT formed respectively according to Examples 1 to 3.

Referring to FIG. 7A, when annealing is performed at 200° C. (Example 1), a crystalline region is not observed anywhere of an interface A of TaOx/IGZO or a neighbored place B of a channel region which is $IGZO/SiO_2$ interface.

Referring to FIG. 7B, when annealing is performed at 300° C. (Example 2), small crystalline grains are formed in an entire IGZO layer, as well as TaOx/IGZO interface C and a neighboring place D of a channel region, which is an $IGZO/SiO_2$ interface. Thus, it is analyzed that IGZO layer is rearranged over an entire region while small crystalline grains are formed within the amorphous matrix. Herein, the small crystalline grains may be disposed to be isolated from each other.

Referring to FIG. 7C, when annealing is performed at 400° C. (Example 3), the size of crystalline grains becomes greater in an entire IGZO layer compared to the annealing performed at 300° C., and crystallinity of an interface F of $IGZO/SiO_2$ increases. Further, as crystallinity of an interface E of TaOx/IGZO is higher than the interface F of $IGZO/SiO_2$, it is assumed that crystallization is performed in depth direction of IGZO layer, i.e., in a direction of $SiO_2$ (which is a gate insulating film) after crystallization by Ta starts in TaOx/IGZO interface therefrom.

Figure 8A:
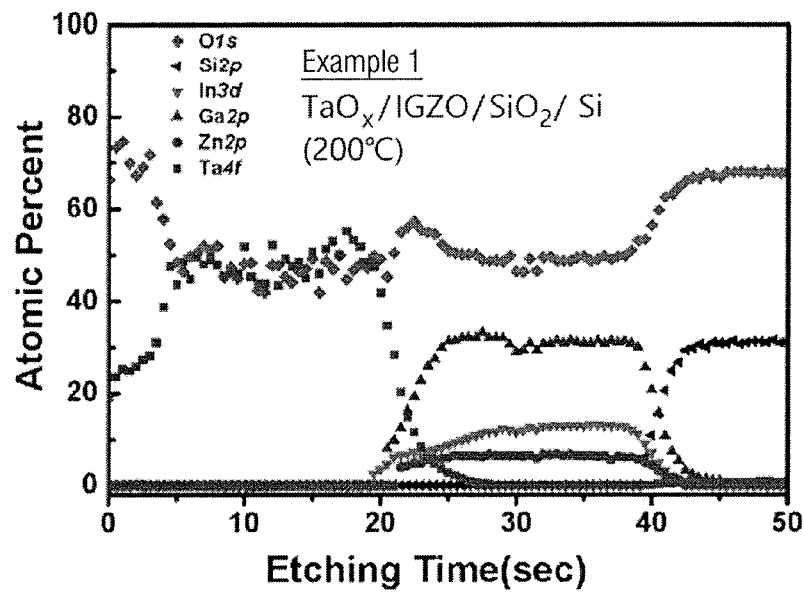
FIGS. 8A and 8B illustrate an atom composition profile in a depth direction with respect to TaOx/IGZO/$SiO_2$/Si stacks of TFT formed according to Examples 1 and 2.
Figure 8B:
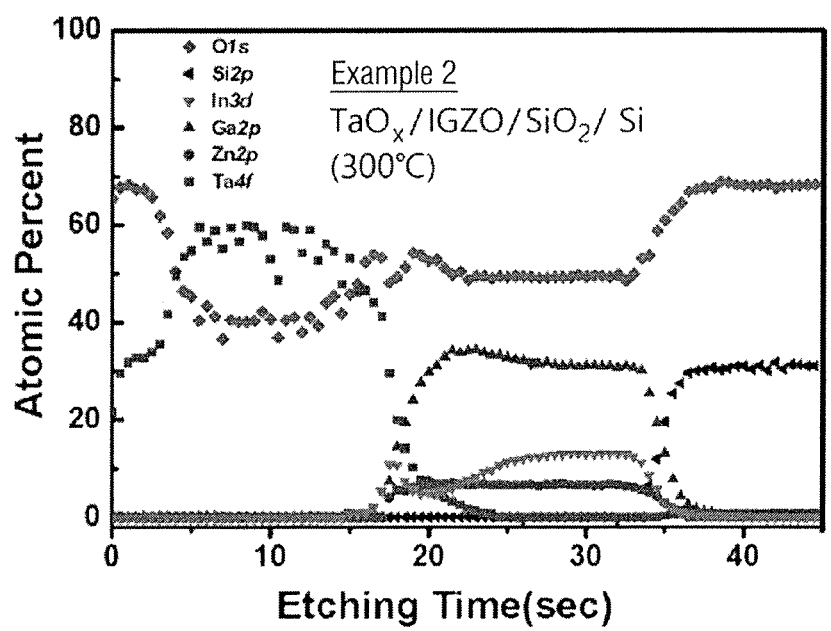

FIGS. 8A and 8B are graphical representations respectively provided to illustrate atom composition profiles in a depth direction with respect to $TaOx/IGZO/SiO_2/Si$ stacks of TFT formed according to Examples 1 and 2. The above may be obtained by sputtering $Ar^+$ ion of 1 keV energy on a surface of the stacks with the X-ray photo electron spectroscopy method (XPS, SIGMA PROBE ThermoG, UK).

Referring to FIGS. 8A and 8B, as a Ta layer is oxidized after being annealed and modified to TaOx layer, a TaOx/$IGZO/SiO_2$ stack is confirmed to be formed. In FIG. 8B, as a fraction of In and Ga atoms slightly increases on an interface within Ta layer, it is assumed that oxygen atoms bonded with In and Ga react with Ta.

Figure 9:
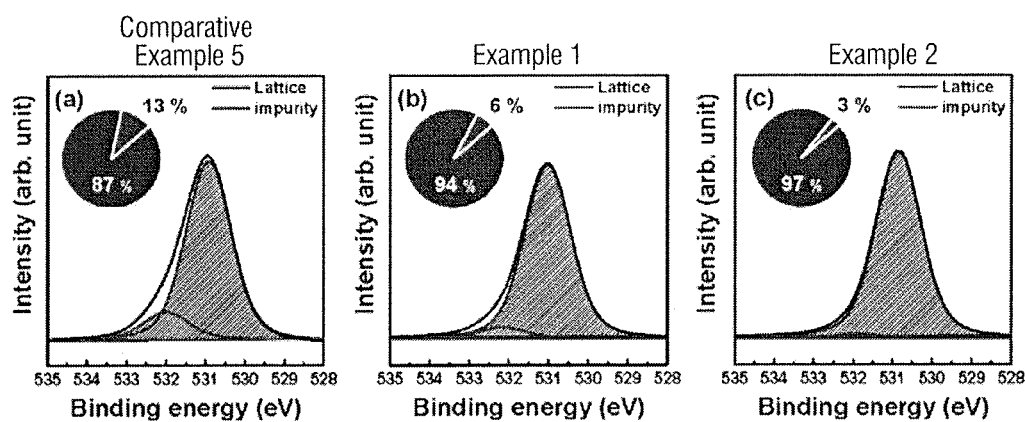
FIG. 9 illustrates an O 1s XPS spectrum within IGZO layer of resulting materials according to Example 1(b), Example 2(c) and Comparative Example 5(a)

FIG. 9 is a view provided to illustrate O 1s XPS spectrum within IGZO layer of resulting materials according to Example 1(b), Example 2(c) and Comparative Example 5(a);

Referring to FIG. 9, sub-peaks at 530.9 and 532.0 eV represent oxygen bonded with metal ions being completely coordinated (M-O lattice) and hydroxyl group-related oxygen bond, respectively. With respect to IGZO layer (Example 2, (c)) in which Ta layer is formed on an upper portion and annealing is performed at 300° C. in oxygen atmosphere compared to IGZO layer (Comparative Example 5, (a)) in which Ta layer is not formed and crystallization annealing is not performed, M-O lattice fraction greatly increases from 87% to 97% while hydroxyl group-related fraction greatly decreases from 13% to 3%. Accordingly, in consideration of decrease in hydroxyl group-related fraction, oxygen species loosely bonded with metal atom within IGZO layer, e.g., interstitial oxygen, hydroxyl group, or the like, are removed and consumed while TaOx is formed by reacting with Ta during the annealing process. Further, an increase in M-O lattice fraction indicates increase in a crystallization rate of IGZO, which is described below with reference to FIG. 10.

Figure 10:
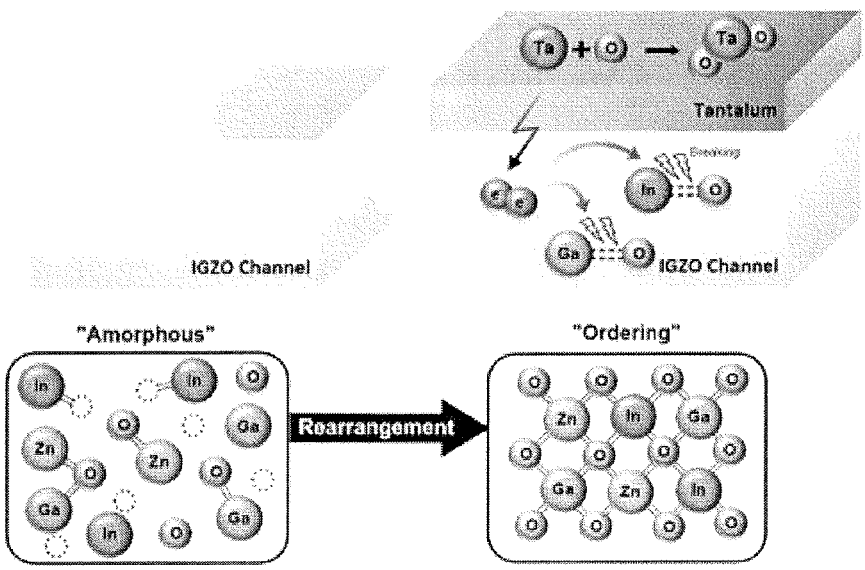
FIG. 10 schematically illustrates crystallization of IGZO by Ta.

FIG. 10 is a schematic view provided to explain crystallization of IGZO by Ta.

Referring to FIG. 10, as an interface of a Ta layer on IGZO layer is oxidized into TaOx with oxygen species loosely bonded with metal atoms within IGZO layer, the Ta layer may emit electrons into the IGZO layer. Such electrons may be delivered to an antibonding orbital of a M-O bond, and accordingly, the M-O bond of an interface may become weak. Further, as M-O bond of the interface becomes weak during the annealing process, it may be rearranged from the interface after being broken and such rearrangement may be transferred within IGZO layer. Thus, an entire IGZO layer may be modified to be crystalline, e.g., polycrystalline, at a relatively low temperature.

The following Table 2 shows field-effect electron mobility ($\mu_{FE}$), subthreshold swing (SS), subthreshold voltage ($V_{TH}$), and Ion/off of TFT according to Examples 1 to 3 and Comparative Example 5.

TABLE 2

| | $\mu_{FE}$ (cm$^2$/Vs) (@ $V_{DS}$ = 0.1 V) | SS (V/decade) (@ $V_{DS}$ = 0.1 V) | $V_{TH}$ (V) (@ $V_{DS}$ = 5.1 V) | $I_{on/off}$ |
|---|---|---|---|---|
| Comparative Example 5 | 18 ± 0.6 | 0.8 ± 0.1 | 0.9 ± 0.2 | 1.2 × 10$^7$ |
| Example 1 | 42.7 ± 2.7 | 0.4 ± 0.1 | 0.5 ± 0.2 | 3.4 × 10$^7$ |
| Example 2 | 54.0 ± 4.7 | 0.3 ± 0.1 | 0.2 ± 0.2 | 4.4 × 10$^7$ |
| Example 3 | 37.3 ± 1.1 | 0.5 ± 0.1 | 0.7 ± 0.3 | 2.2 × 10$^7$ |

Referring to Table 2, compared to a TFT according to Comparative Example 5 (in which Ta layer is not formed on IGZO layer and second annealing is not performed), TFTs according to Example 1, Example 2, and Example 3 (in which Ta layer is formed on IGZO layer and second annealing is performed at 200° C., 300° C., and 400° C.) show a high $\mu_{FE}$ value and a low $V_{TH}$ value. With respect to Example 2 (in which annealing is performed at 300° C.), an enhanced $\mu_{FE}$ value of three times that of Comparative Example 5 is obtained. However, with respect to Example 3 in which annealing is performed at 400° C., a lower $\mu_{FE}$ value, i.e., lower electron mobility is obtained compared to Example 2.

In consideration of the above results, it is assumed that crystallization advances too much and grain boundaries (which can operate as an energy barrier to electron conduction) are extensively formed with respect to Example 3. Meanwhile, with respect to Example 2, excellent electron mobility is obtained because crystallization advances in some degree, but grain boundaries are generated without excessiveness and/or crystalline grains do not grow up as much as a grain boundary is formed.

Figure 11:
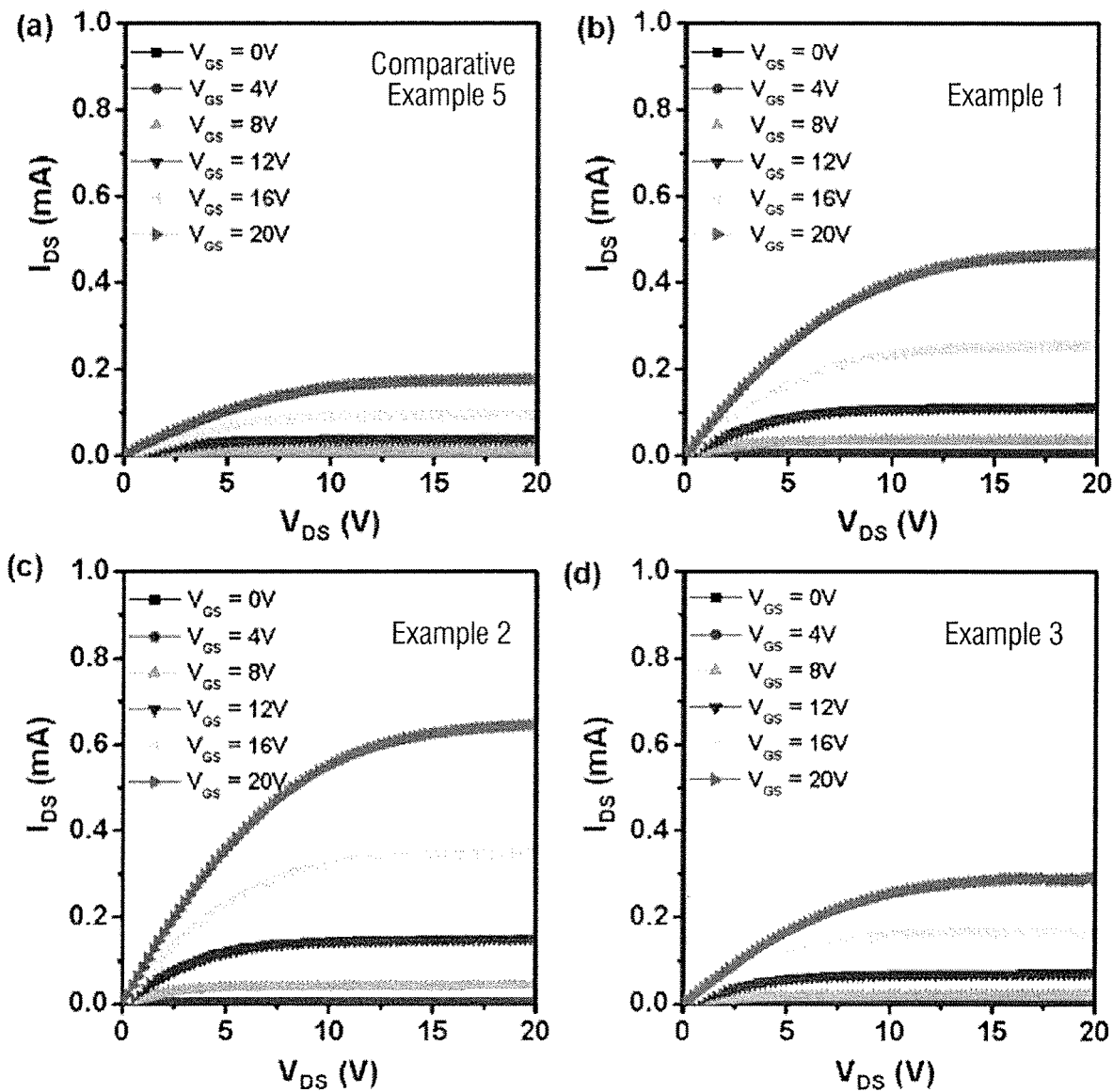
FIG. 11 illustrates an output characteristic ($I_{DS}$-$V_{DS}$) of TFT according to Examples 1 to 3 and Comparative Example 5.

FIG. 11 is graphical representation provided to illustrate an output characteristic ($I_{DS}$-$V_{DS}$) of TFTs according to Examples 1 to 3 and Comparative Example 5.

Referring to FIG. 11, while the output characteristic of TFT according to Example 1 is enhanced compared to TFT according to Comparative Example 5 and output characteristic of TFT according to Example 2 is enhanced, the output characteristic of TFT according to Example 3 is enhanced compared to Comparative Example 5 but reduced compared to Example 1.

As described above with reference to Table 2, it is understood that, with respect to the TFT according to Example 4 in which grain boundary is extensive, the output characteristic is also lowered due to decrease in electron mobility.

By way of summation and review, for a silicon film used as a semiconductor film of a transistor, an amorphous silicon film or a polycrystalline silicon film may be used. For example, with respect to a transistor included in a large display apparatus, an amorphous silicon film may be used in which film characteristics are relatively uniform even when formed as a large dimensional size. As another example, with respect to a device including a driving circuit or the like, a polycrystalline silicon film may be used to effect high field effect mobility. A method of annealing the amorphous silicon film at high temperature or treating with a laser beam may be used to form the polycrystalline silicon film.

When an oxide semiconductor is used as a channel layer of a transistor, an amorphous oxide semiconductor layer may have disadvantages relative to electrical and chemical stability. Conversely, forming a crystalline oxide semiconductor layer from an amorphous layer may involve annealing at high temperature (e.g., more than 700 degrees C.) or performing an in-situ heating method.

As described above, embodiments may provide a thin film transistor and a vertical NAND flash memory device including a polycrystalline oxide semiconductor thin film which is formed at relatively low temperature range and exhibits high field effect mobility.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate;
   a liner pattern including a transition metal on the substrate;
   a polycrystalline metal oxide pattern on the liner pattern;
   an insulating film extending along a sidewall of the liner pattern, a sidewall of the polycrystalline metal oxide pattern, and an upper surface of the polycrystalline metal oxide pattern; and
   a gate electrode on the insulating film.

2. The semiconductor device as claimed in claim 1, further comprising a contact on at least one side of the gate electrode,
   wherein the contact is connected to the polycrystalline metal oxide pattern and penetrates through the insulating film.

3. The semiconductor device as claimed in claim 1, wherein the insulating film does not extend along an upper surface of the gate electrode.

4. The semiconductor device as claimed in claim 1, further comprising an insertion insulating film between the substrate and the liner pattern.

5. The semiconductor device as claimed in claim 1, wherein the liner pattern includes a transition metal oxide or a transition metal oxynitride.

6. The semiconductor device as claimed in claim 1, wherein the polycrystalline metal oxide pattern includes an In-Ga oxide film, an In-Zn oxide film, or an In-Ga-Zn oxide film.

7. The semiconductor device as claimed in claim 1, wherein the transition metal includes at least one of Ta, Ti, or Mo.

8. A semiconductor device, comprising:
a transition metal oxynitride film;
a conductive pattern on the transition metal oxynitride film; and
a metal oxide film between the transition metal oxynitride film and the conductive pattern.

9. The semiconductor device as claimed in claim 8, wherein the transition metal oxynitride film and the metal oxide film are in contact with each other.

10. The semiconductor device as claimed in claim 8, wherein the metal oxide film is a polycrystalline metal oxide film.

11. The semiconductor device as claimed in claim 8, wherein the metal oxide film includes an In-Ga oxide film, an In-Zn oxide film, or an In-Ga-Zn oxide film.

12. The semiconductor device as claimed in claim 8, wherein a transition metal included in the transition metal oxynitride film includes at least one of Ta, Ti, or Mo.

13. A semiconductor device, comprising:
a first conductive pattern extending in a first direction on a substrate;
a metal oxide film extending in a thickness direction of the substrate and including a first end and a second end which are opposite to each other, the first end of the metal oxide film being connected to the first conductive pattern;
an insulating film extending along a first sidewall of the metal oxide film;
a liner film extending along a second sidewall opposite to the first sidewall of the metal oxide film and including a transition metal;
a gate pattern spaced away from the substrate and on the insulating film; and
a second conductive pattern connected to the second end of the metal oxide film on the metal oxide film.

14. The semiconductor device as claimed in claim 13, wherein the metal oxide film includes a polycrystalline metal oxide material.

15. The semiconductor device as claimed in claim 13, wherein the metal oxide film includes one of an In-Ga oxide film, an In-Zn oxide film, and an In-Ga-Zn oxide film.

16. The semiconductor device as claimed in claim 13, wherein the liner film includes a transition metal oxide.

17. The semiconductor device as claimed in claim 13, wherein the liner film includes a transition metal oxynitride.

18. The semiconductor device as claimed in claim 13, wherein the transition metal includes at least one of Ta, Ti, and Mo.

* * * * *